US010533905B2

(12) United States Patent
Sheplak et al.

(10) Patent No.: US 10,533,905 B2
(45) Date of Patent: Jan. 14, 2020

(54) MEMS CAPACITIVE WALL SHEAR STRESS VECTOR MEASUREMENT SYSTEM

(71) Applicant: University of Florida Research Foundation, Incorporated, Gainesville, FL (US)

(72) Inventors: Mark Sheplak, Gainesville, FL (US); Casey B. Keane, Albuquerque, NM (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 15/906,748

(22) Filed: Feb. 27, 2018

(65) Prior Publication Data
US 2018/0252600 A1    Sep. 6, 2018

Related U.S. Application Data

(60) Provisional application No. 62/465,458, filed on Mar. 1, 2017.

(51) Int. Cl.
*G01L 1/14*    (2006.01)
*C23C 14/02*   (2006.01)
(Continued)

(52) U.S. Cl.
CPC ............ *G01L 1/142* (2013.01); *C23C 14/021* (2013.01); *C23C 14/165* (2013.01); *C23C 14/185* (2013.01); *C23C 14/34* (2013.01); *C23C 14/5873* (2013.01); *G03F 7/162* (2013.01); *G03F 7/168* (2013.01); *G03F 7/20* (2013.01); *G03F 7/32* (2013.01); *G03F 7/40* (2013.01); *G03F 7/422* (2013.01)

(58) Field of Classification Search
CPC .  G01L 1/00; G01L 1/142; G03F 7/162; G03F 7/168; G03F 7/20; G03F 7/32; G03F 7/40; G03F 7/422; C23C 14/021; C23C 14/165; C23C 14/185; C23C 14/34; C23C 14/5873
USPC .......................................................... 73/780
See application file for complete search history.

(56) References Cited

U.S. PATENT DOCUMENTS 6,426,796 B1 * 7/2002  Pulliam .................... G01F 1/28
                                                          356/477
6,966,231 B2 * 11/2005 Sheplak ................... G01F 1/20
                                                          73/861

(Continued)

OTHER PUBLICATIONS

Schmidt et al., "Design and calibration of a microfabricated floating-element shear-stress sensor," IEEE Transaction on Electron Devices, Jun. 1988, pp. 750-757, vol. 35, No. 6.
Hutchins et al., "Hot-wire spatial resolution issues in wall-bounded turbulence," Journal of Fluid Mechanics, Sep. 2009, pp. 103-136, vol. 635.

(Continued)

*Primary Examiner* — Octavia Hollington
(74) *Attorney, Agent, or Firm* — Alston & Bird LLP

(57) ABSTRACT

Microelectromechanical systems (MEMS)-based devices capable of measuring wall shear stress vectors in three-dimensional aerodynamic flow fields are provided. A device can include a sensor that senses wall shear stress vectors in two in-plane axes and an interface circuit including a modulation section and a demodulation section. The device can be capable of making direct, real-time wall shear stress measurements without any need for using secondary measurements and/or models for validation.

13 Claims, 27 Drawing Sheets

(51) Int. Cl.

| | |
|---|---|
| *C23C 14/18* | (2006.01) |
| *C23C 14/58* | (2006.01) |
| *G03F 7/42* | (2006.01) |
| *G03F 7/40* | (2006.01) |
| *G03F 7/16* | (2006.01) |
| *C23C 14/34* | (2006.01) |
| *G03F 7/20* | (2006.01) |
| *G03F 7/32* | (2006.01) |
| *C23C 14/16* | (2006.01) |

(56) References Cited

U.S. PATENT DOCUMENTS

| | | | |
|---|---|---|---|
| 8,833,175 B2 | 9/2014 | Chandrasekharan et al. | |
| 8,879,052 B2* | 11/2014 | Horowitz | G01N 13/02 356/35.5 |
| 8,984,941 B2* | 3/2015 | Netzer | G01P 15/125 73/510 |
| 2018/0038746 A1* | 2/2018 | Barnard | G01N 11/02 |

OTHER PUBLICATIONS

Bruschi et al., "A method for cross-sensitivity and pull-in voltage measurement of MEMS two-axis accelerometers," Sensors and Actuators A, Sep. 2005, pp. 185-193, vol. 123-124.

Barillaro et al., "Analysis, simulation and relative performances of two kinds of serpentine springs," Journal of Micromechanics and Microengineering, Feb. 2005, pp. 736-746, vol. 15.

Naughton et al., "Modem developments in shear-stress measurement," Progress in Aerospace Sciences, Aug. 2002, pp. 515-570, vol. 38.

Winter, "An outline of the techniques available for the measurement of skin friction in turbulent boundary layers," Progress in Aerospace Sciences, 1977, pp. 1-57, vol. 18.

Chandrasekharan et al., "A microscale differential capacitive direct wall-shear-stress sensor," Journal of Microelectromechanical Systems, Jun. 2011, pp. 622-635, vol. 20, No. 3.

Beresh et al., "Fluctuating wall pressures measured beneath a supersonic turbulent boundary layer," Physics of Fluids, Jul. 2011, pp. 1-16, vol. 23, No. 075110.

\* cited by examiner

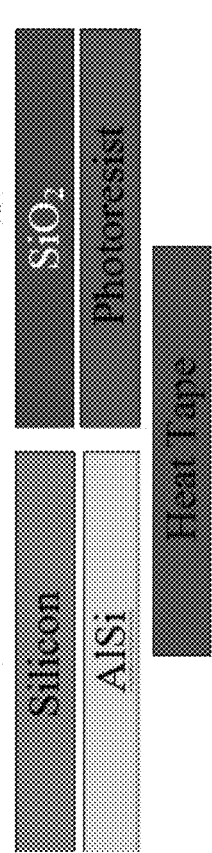

MEMS CAPACITIVE WALL SHEAR STRESS VECTOR MEASUREMENT SYSTEM

CROSS-REFERENCE TO RELATED APPLICATION

This application claims the benefit of U.S. Provisional Patent Application Ser. No. 62/465,458, filed Mar. 1, 2017, which is incorporated herein by reference in its entirety, including any figures, tables, and drawings.

STATEMENT OF GOVERNMENT SUPPORT

This invention was made with government support under grant number DE-AC0485000 awarded by the Department of Energy (DOE). The government has certain rights in the invention.

BACKGROUND

Aerodynamic drag due to viscous skin friction and/or pressure separation effects can severely reduce efficiency of vehicles during operation. Inability to obtain accurate wall shear stress measurements hinders better understanding of, and subsequently solving, this long-standing issue.

Although indirect methods for measuring wall shear stress, such as hotwires or particle image velocimetry (PIV) field visualization, are available, they are only primarily applicable in highly controlled testing environments, require extensive in situ calibration, and rely on inferred relations to produce a measurement. In some instances, hotwires may even disturb the turbulent flow to be measured by adding energy to the system.

Related art sensors are capable of directly measuring static or dynamic shear stress, and have achieved a noise floor of 14.9 µPa with 102 dB of dynamic range (U.S. Pat. No. 8,833,175 and Ref. [5]). These sensors, however, suffer from the drawback of single-axis measurements, limiting a real-time measurement of a 360-degree vector projection to 1 degree for any given measurement instance. In addition, accuracy in single-axis sensors is compromised by alignment in testing and multi-dimensional flow effects.

BRIEF SUMMARY

Embodiments of the subject invention provide microelectromechanical system (MEMS)-based devices capable of measuring (configured to measure) wall shear stress vectors in three-dimensional aerodynamic flow fields. In some embodiments, the device can measure both mean and fluctuating components of the wall shear stress in a controlled environment as well as field applications such as wind tunnels. Advantageously, the devices provided herein are capable of making direct, real-time wall shear stress measurements without any need for using secondary measurements and/or models for validation.

In an embodiment, a MEMS-based device can comprise a floating element connected to a set of differentially positioned comb fingers. The floating element can be bulk-micromachined, an advantageous feature allowing the device to withstand prolonged exposure to various turbulent fluid fields.

In many embodiments, a sensing device as provided herein can measure shear stress in two orthogonal planar directions by utilizing specifically configured flexures such as, for example, serpentine tethers, to achieve de-coupled cross-axis transduction.

In some embodiments, a sensing device as provided herein can employ a dual-frequency synchronous modulation/demodulation interface circuit capable of independently measuring shear stress along the two in-plane orthogonal axes tangential to the fluid-wall interface.

Advantageously, by detecting wall shear stress in two directions, a vector measurement of shear forces tangential to the surface can be produced using devices of embodiments of the subject invention.

DETAILED DESCRIPTION

Embodiments of the subject invention provide microelectromechanical system (MEMS)-based devices capable of measuring (or configured to measure) wall shear stress vectors in three-dimensional aerodynamic flow fields. In some embodiments, the device can measure both mean and fluctuating components of the wall shear stress in controlled environment as well as complex flow field applications such as wind tunnels. Advantageously, the devices provided herein are capable of making direct, real-time wall shear stress measurements without requiring secondary measurements and/or models for validation.

Currently, there is no related art sensor system commercially available for capturing time-resolved, direct measurement of wall shear stress at a microscale. Nor is there any related art sensor capable of compliant dual-axis sensing at the microscale. Embodiments of the subject invention can provide these advantageous properties.

Figure 1:
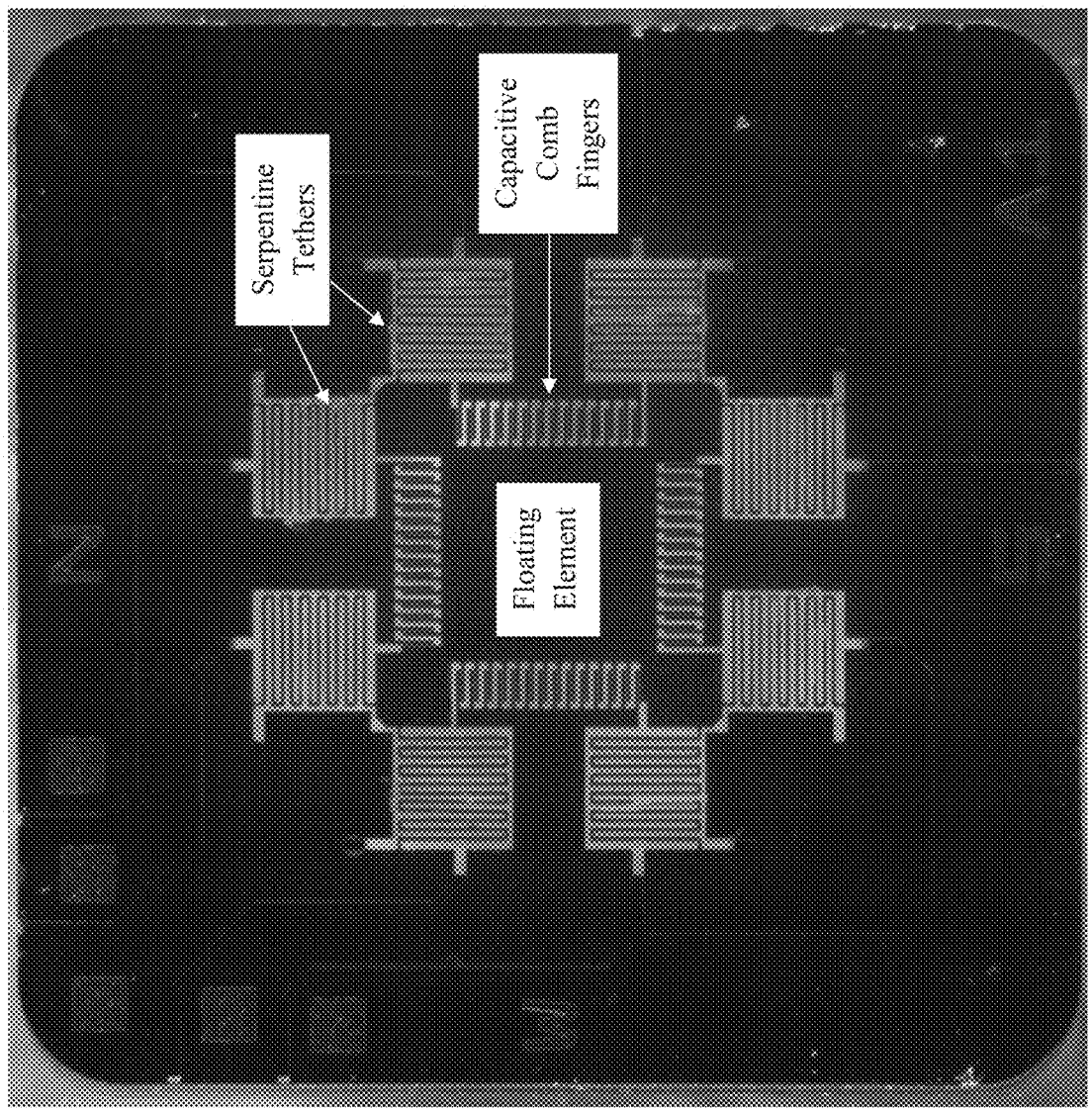
FIG. 1 is an image of a microelectromechanical system (MEMS)-based wall shear stress sensor according to an embodiment of the subject invention.
Figure 2:
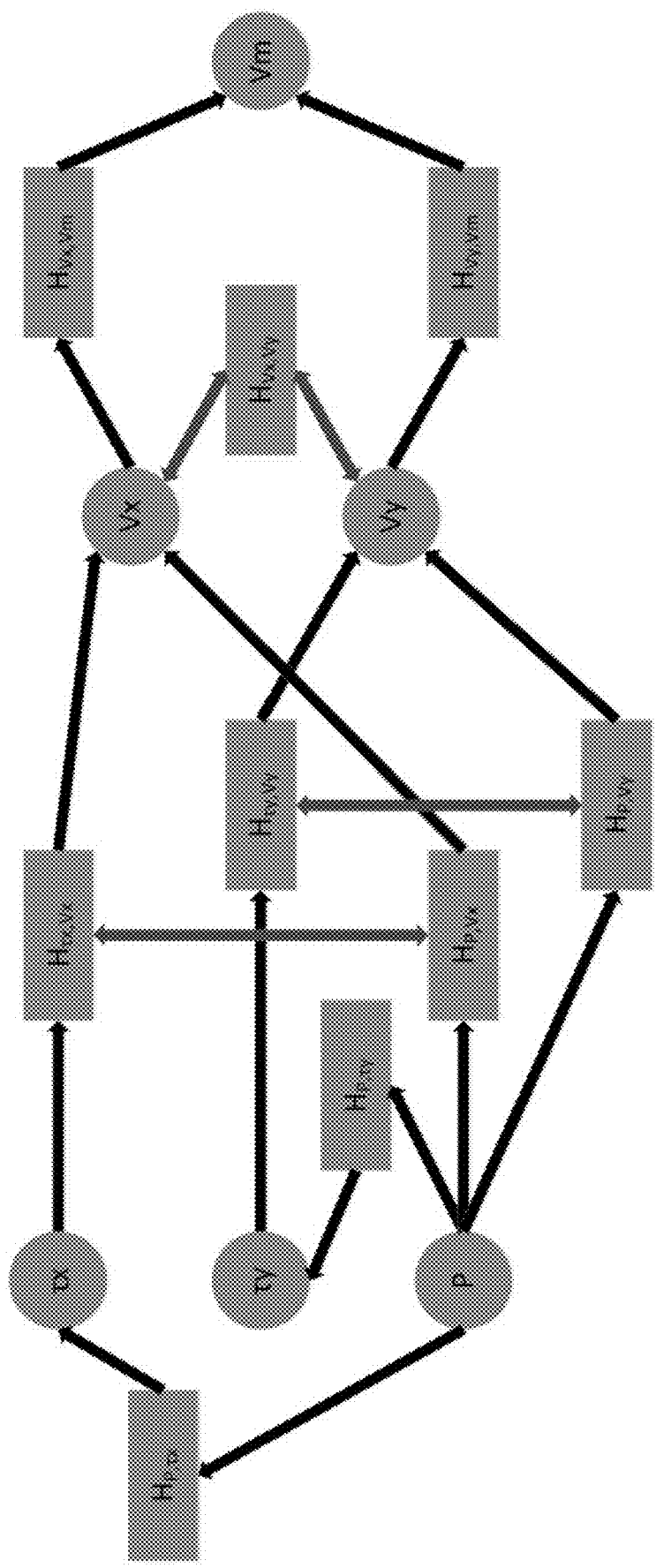
FIG. 2 illustrates the interplay between different forces acting on the sensor and the corresponding voltage output. $\tau_x$ and $\tau_y$ represent shear stress in the x and y directions, respectively, while P is pressure. $V_x$ and $V_y$ are voltages across x and y axes, respectively, while $V_m$ is the single voltage on the output, and the various notations of H are transfer functions between those different force values. This figure shows the different cross-axis interferences that need to be accounted for during device design.
Figure 3:
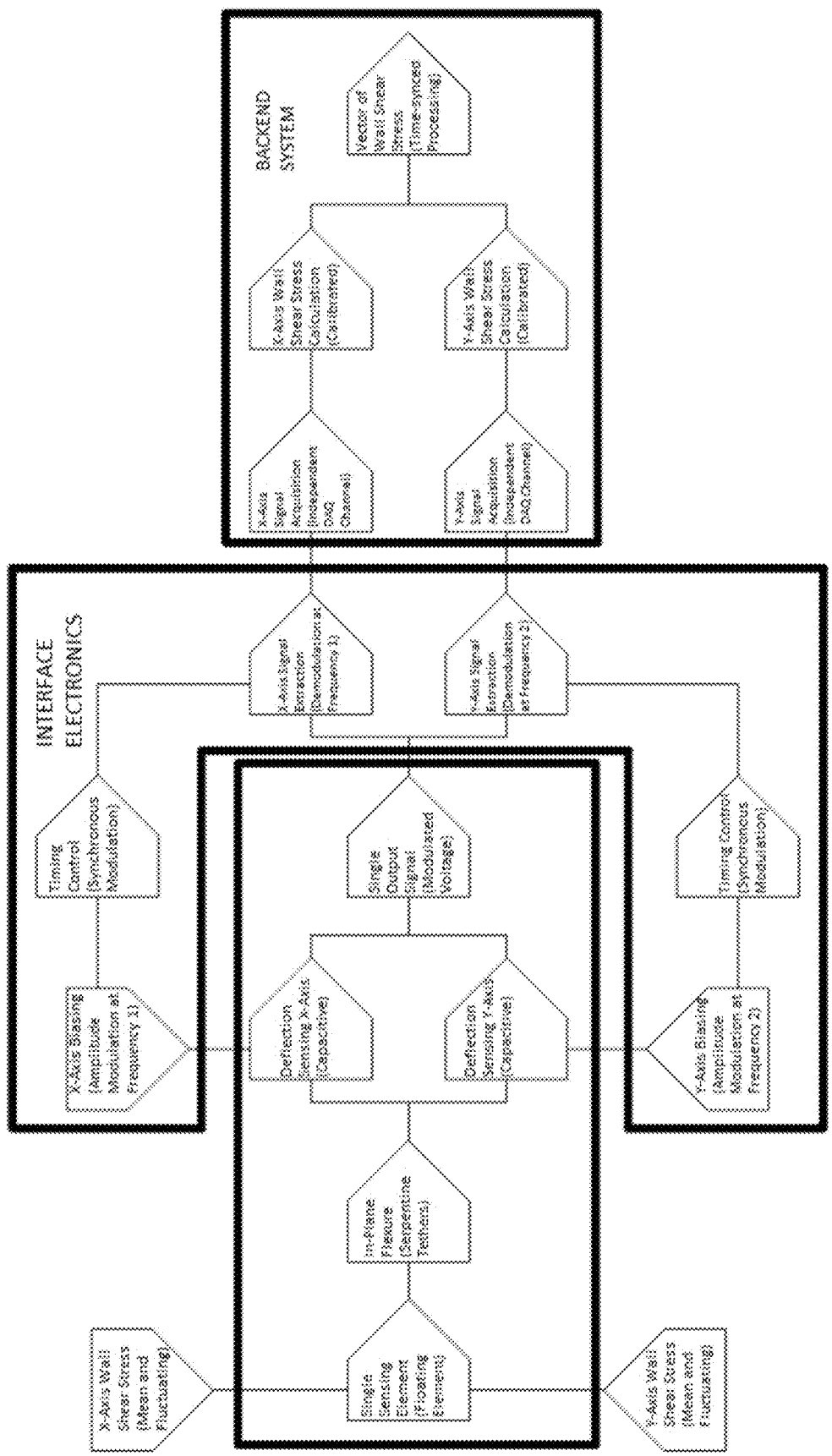
FIG. 3 is a flow chart of the vector measuring process taking place within a wall shear stress sensor according to an embodiment of the subject invention. Each block represents a particular element during the process. For example, there is an in-plane flexure attached between the sensing element and the input sensing mechanisms. Three distinct systems are shown herein: the sensor die/package; the interface electronics; and the general acquisition/processing system.
Figure 4:
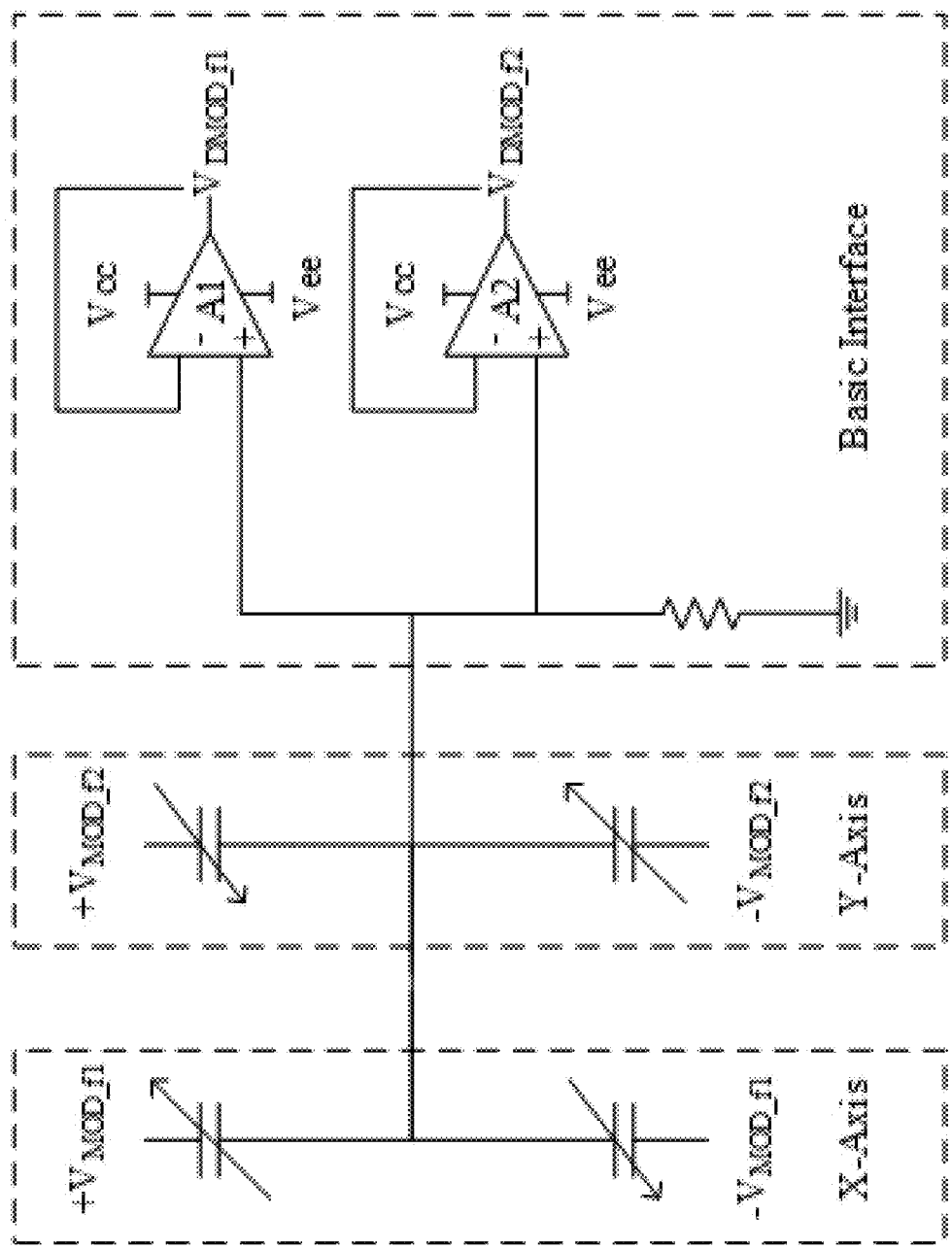
FIG. 4 is a first circuit representation of the front-end interface electronics, using either pseudo-differential or fully differential amplifier schemes.
Figure 5:
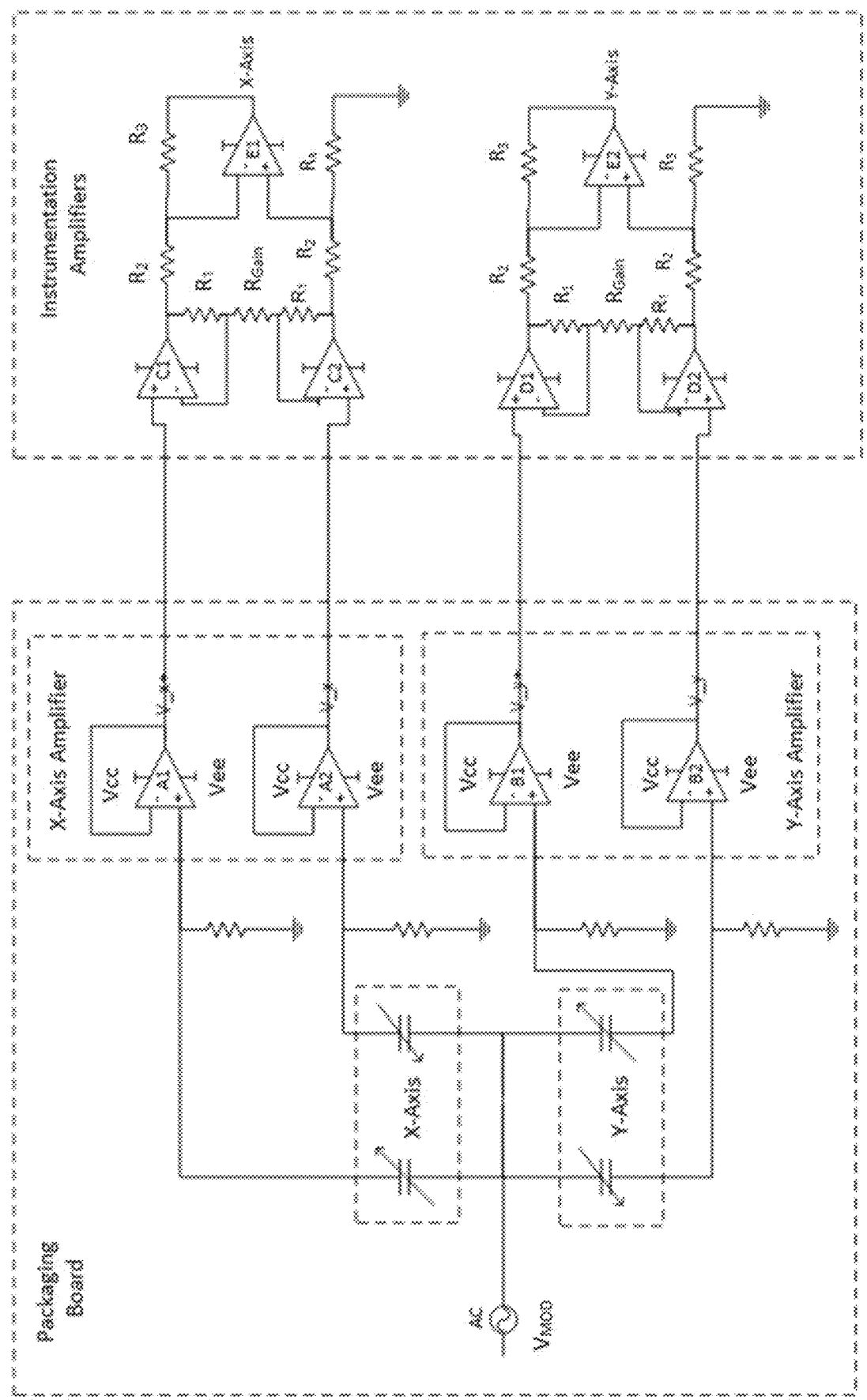
FIG. 5 is a second circuit representation of the front-end interface electronics, using either pseudo-differential or fully differential amplifier schemes.

In some embodiments, a MEMS-based device comprises a floating element and a set of differentially capacitive comb fingers (FIG. 1). The floating element can be quadrangular (e.g., square), and the comb fingers can be positioned on all four sides of the floating element, though embodiments are not limited thereto. The interdigitated comb finger design surrounding the floating element provides capacitive half-bridge for each axis of measurement, while helping reject out-of-plane pressure inputs experienced by the device in a turbulent flow field.

In some embodiments, the floating element can be bulk-machined, an advantageous feature allowing the device to withstand prolonged exposure to turbulent fluid fields without requiring encapsulation. With the floating element chemically etched into a silicon wafer substrate, the overall device presents a flat surface to the fluid flow, maximizing its capability to directly measure two-dimensional tangential surface forces in a variety of external environment. Related art devices (e.g., capacitive accelerometers), on the other hand, are surface-micromachined and, in the absence of encapsulation and/or if not subjected to a controlled environment (e.g., sealed vacuum space), their surface features can protrude into the fluid flow field and thus corrupt the quality of any measured wall shear stress vectors. Advantageously, the combination of a bulk-micromachined floating element and differentially positioned comb fingers together allows the detection of low-magnitude shear stress in a dynamic range.

Furthermore, scaling effects afforded by MEMS-based devices can reduce the overall measurement error as well as maintain spatial resolution when low-magnitude forces are of interest [3]. In order to prevent spatial averaging over the floating element, embodiments of the sensor need to remain under 20 viscous wall units in size, with each wall unit measuring on the order of 10 μm for a turbulent boundary layer (see also, e.g., reference [4], which is hereby incorporated by reference herein in its entirety).

Shear stress sensing devices of embodiments of the subject invention do not require secondary measurements or models for validation, nor do they rely on assumptions regarding the testing environment (e.g., specific tunnel limitations) to obtain force measurements. This is a markedly advantageous feature as compared to related art sensors, which require one or more of the factors aforementioned to produce an estimate of the surface forces, greatly increasing the cost and complexity of the sensing devices and the methods of using the same.

In some embodiments, the sensing device further comprises eight sets of two-dimensional flexures capable of bending (or configured to bend) in planar x and y directions (FIG. 1). Specifically, in order to reduce residual and extension stresses and maximize in-plane sensitivity, the eight sets of flexures (i.e., tethers) can be symmetrically arranged with two sets of flexures connected to each set of comb fingers.

In some embodiments, each set of flexures can be in a configuration selected from serpentine, folded-beam, multi-level, and crab-leg. For example, the flexures can be arranged in a serpentine configuration. In addition, each set of serpentine flexures can have an odd number of meanders to yield equal stiffness coefficients (e.g., spring constants) along both axes, resulting in minimum mechanical cross-axis coupling. Furthermore, flexure configurations provided herein provide matched sensitivity and resonant frequency along each in-plane axis. In some embodiments, depending upon the size of the floating element, the ratio of each set of tethers' width to length can be adjusted accordingly in order to match operational bandwidths to the available spatial resolution.

Advantageously, by sensing deflection along the two in-plane axes, an accurate measure of mean shear stress can be obtained directly with reduced concern over alignment. In addition, devices of embodiments of the subject invention can measure shear stress at the wall as a true vector, including both static and dynamic components.

Those skilled in the art would also recognize that the devices of embodiments of the subject invention provide surface measurement instrumentation capabilities to systems currently unable to measure fluctuating pressures in high-speed turbulent boundary layers (see also reference [8], which is hereby incorporated by reference herein in its entirety). Furthermore, when combined with suitable support systems, data collected using devices of embodiments of the subject invention can be used in real-time active flow control systems, greatly assisting in the delay of flow separation and reduction of pressure drag. The design process can be used in the future as a template for further development in dual-axis shear stress and acceleration sensors.

In some embodiments, a sensing device as provided herein can employ a dual-frequency synchronous modulation/demodulation interface circuit capable of independently measuring (or configured to independently measure) shear stress along the two in-plane orthogonal axes tangential to the fluid-wall interface. Advantageously, data collected using said interface circuit can be reconstructed into directional vector information at each single lumped element point.

Significantly, in order to temporally resolve shear stress vectors, embodiments of the subject invention can rely on simultaneous modulation/demodulation at multiple frequencies to retain relative phase and delays. Furthermore, by performing demodulation in-loop with the analog modulation, the precise timings of surface perturbations caused by fluid flow can be retained. In some embodiments, information thus obtained allows one skilled in the art to analyze the relative phases across different frequency spans and realize the temporal and spatial characteristics, as well as the size and magnitude, of the measured turbulent eddies impacting the surface.

In some embodiments, a calibrated, ready-to-use device can be capable of directly measuring wall shear stress in a variety of flow fields including, but not limited to, controlled environment (e.g., wind tunnels) and field applications (e.g., drones, airplanes), due to its insensitivity to assumptions regarding the flow structure. Depending on the specific applications, the sensing device can be used as an individual unit; in some embodiments, a plurality of sensing devices can be combined into an array and utilized as a collective.

Advantageously, the wall shear stress sensing devices and the methods of using the same as provided herein allow direct, real-time measurements of true force vectors at length scales necessary for resolving turbulent flow structures in complex three-dimensional fields. The additional benefits of the compact size and a lack of requirement for secondary measurements and/or models for validation afford the devices and methods utility in a wide range of applications in a variety of testing facilities.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

Example 1—Fabrication of a Wall Shear Stress Sensing Device

Processing steps involved in fabricating an exemplary embodiment of the sensing device provided herein include photolithography, wet etching, layer deposition (PECVD and sputter), and material removal (DRIE) as detailed in FIGS. 6A-6H. Details of the silicon wafer used to fabricate the device are shown in Table 1 below.

TABLE 1

Details of the silicon wafer used to fabricate the sensing device.

| | |
|---|---|
| Size | 100 mm ± 0.1 mm (diameter), 560 µm ± 11 µm (thickness) |
| Orientation | <1-0-0> ± 0.5 degree |
| Handle Layer | 500 µm ± 10 µm thick, boron-doped to a resistivity of <10 Ω · cm |
| Buried Oxide layer | Approximately 2 µm ± 5% thick |
| Device Layer | 60 µm ± 1 µm thick, phosphorous-doped to a resistivity of <0.005 Ω · cm |
| Surface Oxides | None specified |
| SOI Wafer Source | Ultrasil |

Specifically, the fabrication comprises the following steps:

I. Wafer Treatment

Figure 6A:
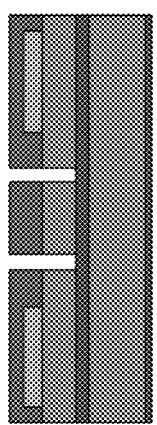
FIGS. 6A-6G represent, in sequence, a process of micromachining a wall shear stress sensing device according to an embodiment of the subject invention.

A: Clean wafers (FIG. 6A)

1.) SC1 clean a.) Etch in 5:1:1 $H_2O:H_2O_2:NH_4OH$ for 10 minutes at 75° C.

b.) Triple rinse with DI water

2.) SC2 clean a.) Etch in 6:1:1 $H_2O:H_2O_2:HCl$ for 10 minutes at 75° C.

b.) Triple rinse with DI water

Figure 6B:
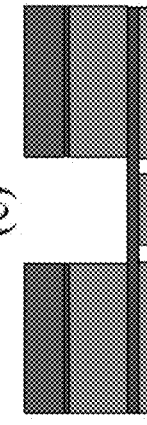
Figure 6C:
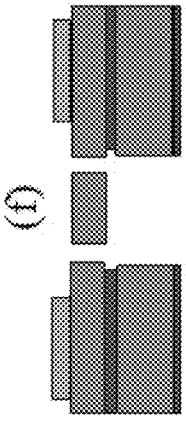
Figure 6D:
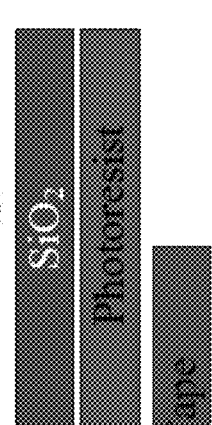
Figure 6E:
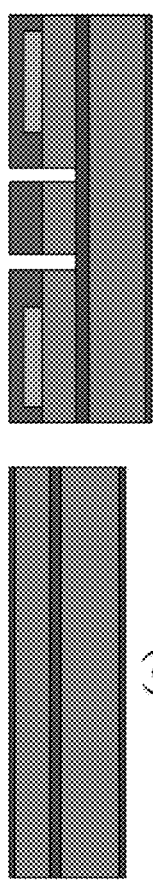
Figure 6F:
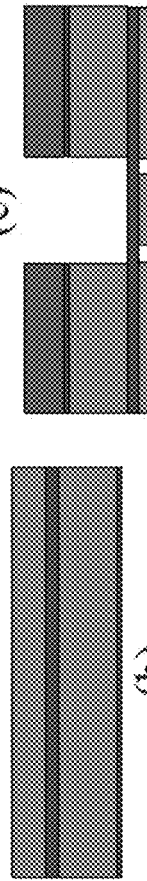
Figure 6G:
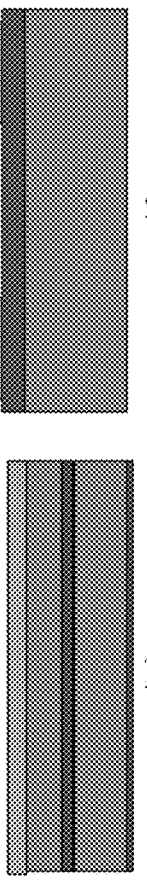

B: Remove any frontside oxide layer (FIG. 6B)

1.) Confirm oxide thicknesses with Filmetrics interferometry measurement

2.) Protect backside of wafer a.) HMDS coat wafer backside b.) Spin 6.5 µm AZ9260 photoresist on backside using Delta 80 c.) Soft bake for 3 minutes at 112° C. using hot plate

3.) Etch oxide layer from frontside a.) Etch in 6:1 BOE (50% over-etch at etch rate ~100 nm/min)

b) Triple rinse in DI water

4.) Confirm oxide removal with Filmetrics interferometry measurement

II. Frontside Metallization
A: Deposit frontside aluminum layer (FIG. 6C)
1.) Protect backside of wafer—the same photoresist from previous step can be used here
   a.) HMDS coat wafer backside
   b.) Spin 6.5 μm AZ9260 photoresist on backside using Delta 80
   c.) Soft bake for 3 minutes at 112° C. using hot plate
2.) Etch in BOE for quick dip to remove any native oxide ~1 minute
3.) Deposit 0.5 μm of Al/Si 2% using KJL CMS-18 Sputter Deposition tool with recipe G4_200_5

B: Define frontside aluminum pattern (FIG. 6D)
1.) Pattern aluminum windows on frontside of wafer
   a.) HMDS coat wafer frontside
   b.) Spin 1.89 μm Shipley 1813 photoresist on frontside using Delta 80
   c.) Soft bake for 2 minutes at 112° C. using hot plate
   d.) Expose for 150 mJ/cm$^2$ using EVG620
   e.) Develop for 1 minute using AZ 300 MIF developer
   f.) Rinse in DI water
   g.) Hard bake for 20 minutes at 120° C. using Despatch oven
2.) Etch aluminum windows on frontside of wafer
   a.) Etch in 80-15-3-2 Al Etchant targeting 0.75 μm (50% over-etch) for approximately 12 minutes
   b.) Triple rinse in DI water
   c.) Strip photoresist for 15 minutes at 75° C. using PRS 3000
   d.) Triple rinse in DI water
3.) Confirm aluminum thickness with Dektak profilometry and observe with Nikon microscope C: Contact quality confirmation
1.) Anneal in forming gas at 450° C.
2.) Confirm ohmic junctions with device layer via electrical characterization (SCPA)

III. Floating Element Etch
A: Define frontside floating element pattern
1.) Protect backside of wafer
   a.) HMDS coat wafer backside
   b.) Spin 2 μm Shipley 1813 photoresist on backside using Delta 80
   c.) Soft bake for 2 minutes at 112° C. using hot plate
2.) Pattern floating element design on frontside of wafer
   a.) HMDS coat wafer frontside
   b.) Spin 2 μm Shipley 1813 photoresist on frontside using Delta 80
   c.) Soft bake for 2 minutes at 112° C. using hot plate
   d.) Frontside alignment using EVG620
   e.) Expose for 160 mJ/cm$^2$ using EVG620. (a test wafer can be used to generate more accurate exposure time).
   f.) Develop for 1 minute using AZ 300 MIF developer
   g.) Rinse in DI water
   h.) Hard bake for 20 minutes at 120° C. using Despatch oven
   i.) Ash wafer for 1 minute using Anatech barrel asher with 300 W and 300 sccm B: Etch floating element (FIG. 6E)
1.) Etch frontside for 100 cycles with DRIE recipe BARN_FEI targeting for about 58 μm
2.) Etch frontside for 42 cycles with DRIE recipe BARN_SOI targeting clear out. An SOI test wafer can be used to generate a more accurate prediction of necessary cycles. The device layer thickness is 60 μm.
3.) Inspect visually and with Dektak Profilometer to confirm etch stop at buried oxide
4.) Increment additional cycles if needed
   a.) Use DRIE for long passivation cycle to mitigate environmental response
   b.) Strip photoresist for 15 minutes at 75° C. using PRS 3000
   c.) Triple rinse in DI water IV. Cavity Etch
A: Define backside cavity (FIG. 6F)
1.) Deposit required photoresist
   a.) HMDS coat wafer backside
   b.) Spin about 12 μm of AZ9260 photoresist on backside using Delta 80
   c.) Soft bake for 6 minutes at 112° C. using hot plate
   d.) Allow wafer to sit in open air for 30 minutes for proper rehydration
2.) Expose cavity design on backside of wafer
   a.) Front-to-back alignment using EVG620
   b.) Expose for 576 mJ/cm$^2$ using EVG620. A test wafer can be used to generate more accurate exposure time.
3.) Attach frontside of wafer to carrier wafer with Nitto-Denko 150° C. heat tape. The thin film side is the heat release, while the thick film side is pressure.
4.) Expose cavity design on backside of wafer
   a.) Develop for 6 minutes using diluted AZ 400K 3:1 (DI: 400K)
   b.) Rinse in DI water
   c.) Ash wafer for 1 minute using Anatech barrel asher with 300 W and 300 sccm
5.) Etch in 6:1 BOE (50% over-etch at etch rate of approximately 100 nm/min) to remove any backside oxide
6.) Etch backside for 750 cycles with DRIE recipe BARN_CAV targeting 400 μm
7.) Etch backside for 100 cycles with DRIE recipe BARN_SOI targeting clear out. An SOI test wafer can be used to generate a more accurate prediction of necessary cycles. The handle thickness is 500 μm.
8.) Inspect visually and with Dektak Profilometer to confirm etch stop at oxide
9.) Increment additional cycles if needed B: Separate and remove die (FIG. 6G)
1.) Remove BOX layer
   a.) Etch in 6:1 BOE targeting 3 μm for approximately 30 minutes (50% over-etch at etch rate of approximately 100 nm/min)
   b.) Soak in water for 5 minutes to ensure all HF cleared form trenches
   c.) Visually confirm removal of BOX from cavity
2.) Activate heat tape delamination on a hot plate
3.) Transfer to blank carrier wafer
4.) Individually pick and remove devices from carrier C: Begin packaging.

A combination of lumped element modeling and gradient-based descent optimization programs were used to produce several sensor variations within the design space. By applying constraints for bandwidth, pressure rejection, nonlinear deflection, as well as pull-in voltage, a set of optimized tether, finger, and element geometries were generated.

As demonstrated herein, the reduction in cross-axis coupling of the serpentine tethers is a function of the number of meanders within each set of tethers. Thus, numerous dimensional choices can lead to similar device performance. It is, however, important to note that small deviations in each design choice can result in large change in device performance or even non-operative status, creating a highly non-smooth design space. An iterative optimization scheme with randomized trials was therefore necessary to generate a Pareto-front with statistical analysis of the reliability in design errors. FEA analysis of designs confirmed expected relative performance between axes and sufficient separation before higher-order mode resonances.

Through-silicon vias were implemented at the wafer level to establish electrical contact while maintaining front-side hydraulic smoothness of the device. This practice avoids complications arising from perturbing fluid flow and diminishes concerns over wire bond reliability.

Each sensing device was packaged into a recessed PCB dual-board end cap, which was affixed to the end of an aluminum tube with an external nylon sleeve. The overall outside diameter of the tube was on the order of 0.5". A small board holding a voltage buffer amplifier was housed inside the tube and connected via cabling to an external synchronous modulation/demodulation (MOD/DMOD) board, which utilizes a sinusoidal bias voltage that allows for extraction of both DC and AC inputs. An active envelope detector was used for signal rectification.

Advantageously, embodiments of the sensing device buffers high sensor impedance to a low op-amp output impedance, allowing for long cable attachments without changing sensor output voltage. Thus, the overall size of the sensor package that needs to be inserted into a testing model is considerably smaller than previous related art devices. In an exemplary embodiment, one 4"×5" circuit board can be used to encompass all electronic components such that the device can be made compact and transportable, requiring only a single 12 V DC power supply.

Example 2—Measurement of Wall Shear Stress Using the Device

To measure wall shear stress in a static environment (e.g., a laminar flow cell), a mass-flow controller was used to generate a steady pressure gradient over the sensing device which was enclosed in a laminar flow cell. Dynamic response, on the other hand, was characterized using an acoustic plane wave tube (PWT). Utilizing a variable distance sound hard back plate and dual reference microphones, the sensing device was placed at the pressure null of a standing wave pattern, maximizing shear force at that location with a frequency response function generated as a result.

To ascertain sensitivity to pressure in the out-of-plane direction the sensor was flush-mounted in the sound hard boundary termination. Characterization of up to approximately 6.7 kHz cut-on of higher order modes can be carried out in PWT facilities. Furthermore, the sensing device can be tested at a wide range of temperature (e.g., −70° C. to 180° C.) and humidity (e.g., 10%-98%) in an environmental chamber. Additional testing can be carried out to evaluate sensor performance in other canonical flows including, for example, turbulent flow over a flat plate in a low-speed, open-circuit wind tunnel.

The interface circuitry utilizes two asynchronous modulation frequencies, each phase locked to a distinct timing signal. Demodulation of a common node sensor output with the distinct timing signal allowed for envelope rectification of separate basebands in real time. Common mode pressure inputs were seen as residuals in both system outputs and were further isolated in post-processing.

Example 3—Validation Using Finite Element Analysis

As a confirmation of modeling validity, optimized design variables were used to create structures in the COMSOL finite element analysis software. Structural resonant modes were investigated using the eigenfrequency analysis. Results for the design with a 2 mm floating element, N=11 meander count, and 5 kHz resonance target are described herein, as these parameters are employed in the exemplary dual-axis wall stress sensor. A list of resonant frequency values is found in Table 2 below.

TABLE 2

Resonant frequencies for analyzed structural modes.

| Mode Number | Frequency (Hz) | Mode Type |
| --- | --- | --- |
| 1 | 4,882 | Diagonal translation |
| 2 | 4,882 | Diagonal translation |
| 3 | 4,974 | Transverse |
| 4 | 8,701 | Rotational |
| 5 | 9,339 | Tilting |
| 6 | 9,340 | Tilting |
| 7 | 37,521 | Flexing |
| 7 | 45,269 | Translational |

Figure 7:
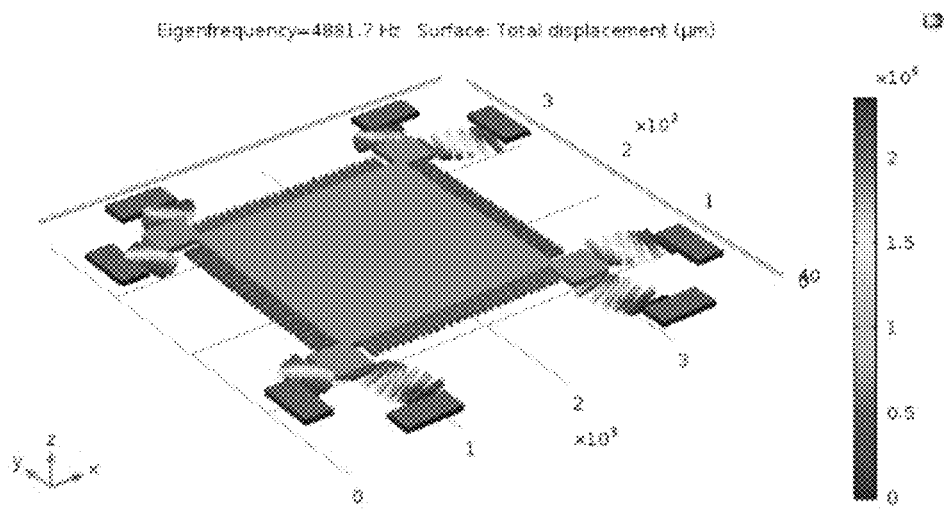
FIG. 7 demonstrates the result of a COMSOL analysis of an exemplary dual-axis design showing one of the first-order structural resonant modes along an in-plane diagonal.
Figure 8:
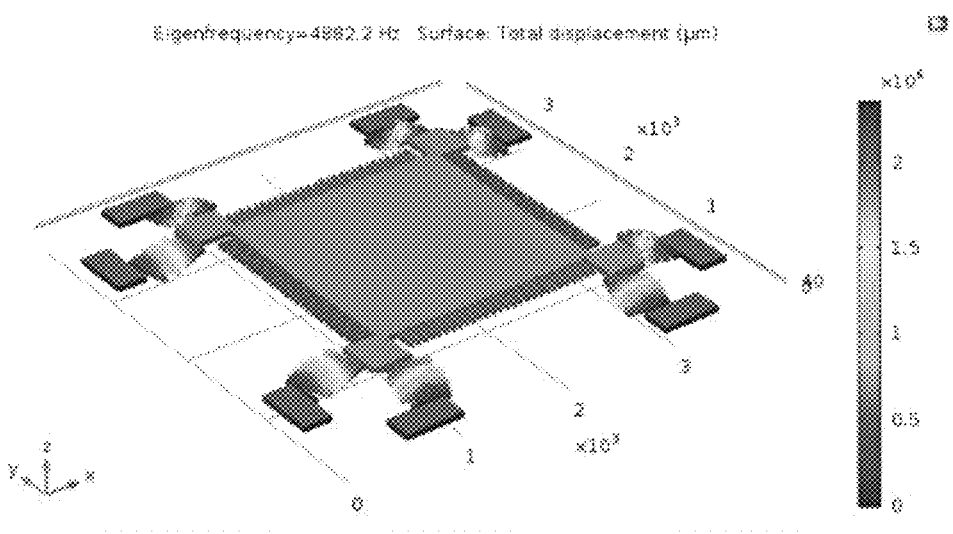
FIG. 8 demonstrates the result of a COMSOL analysis of an exemplary dual-axis design showing the other first-order structural resonant modes along an in-plane diagonal.
Figure 9:
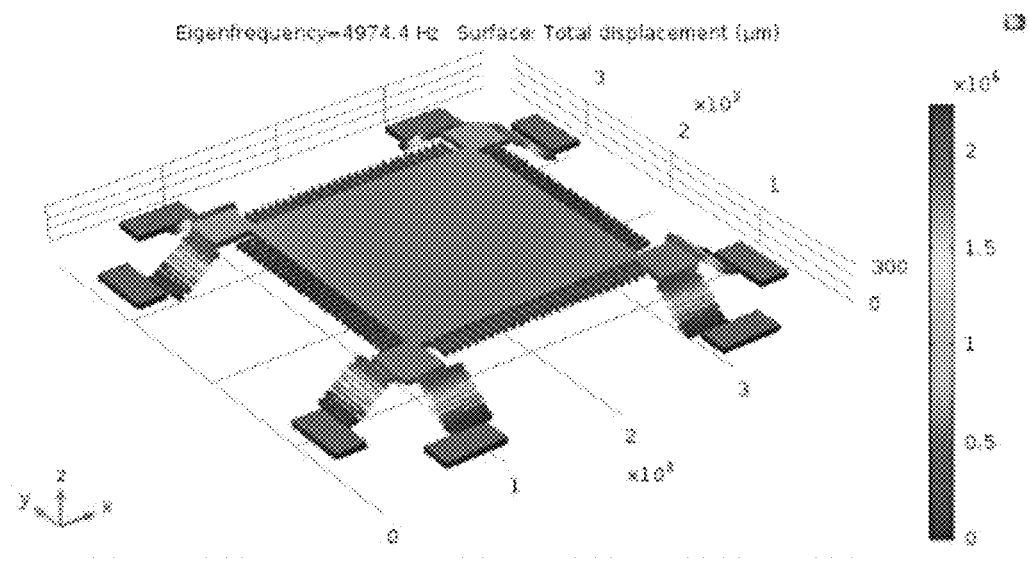
FIG. 9 demonstrates the result of a COMSOL analysis of an exemplary dual-axis design showing structural resonant mode for pressure inputs in an out-of-plane direction.
Figure 10:
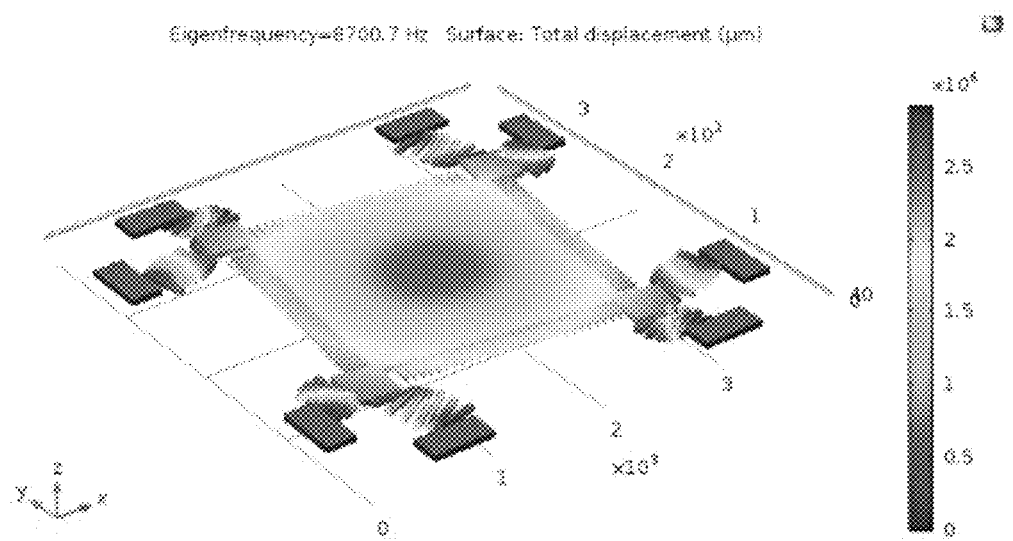
FIG. 10 demonstrates the result of a COMSOL analysis of an exemplary dual-axis design showing rotational structural resonant mode.
Figure 11:
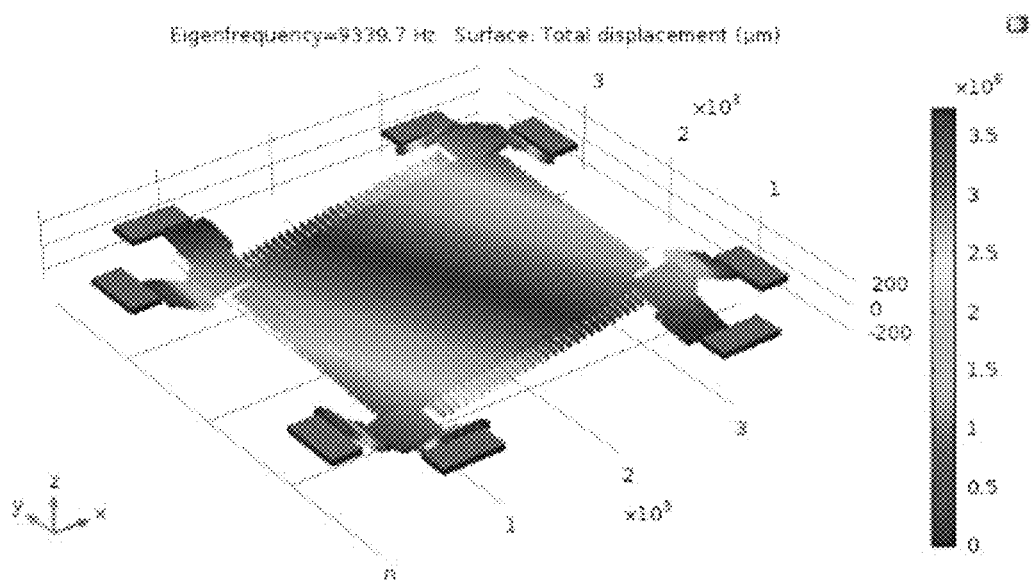
FIG. 11 demonstrates the result of a COMSOL analysis of an exemplary dual-axis design showing one of the structural resonant modes for tilting.
Figure 12:
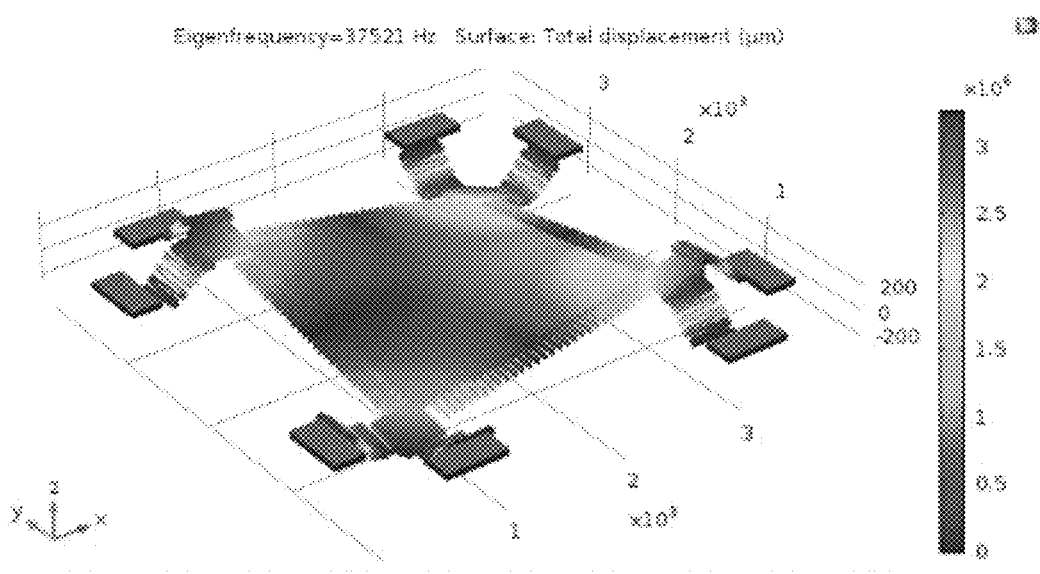
FIG. 12 demonstrates the result of a COMSOL analysis of an exemplary dual-axis design showing the structural resonant mode for flexing.
Figure 13:
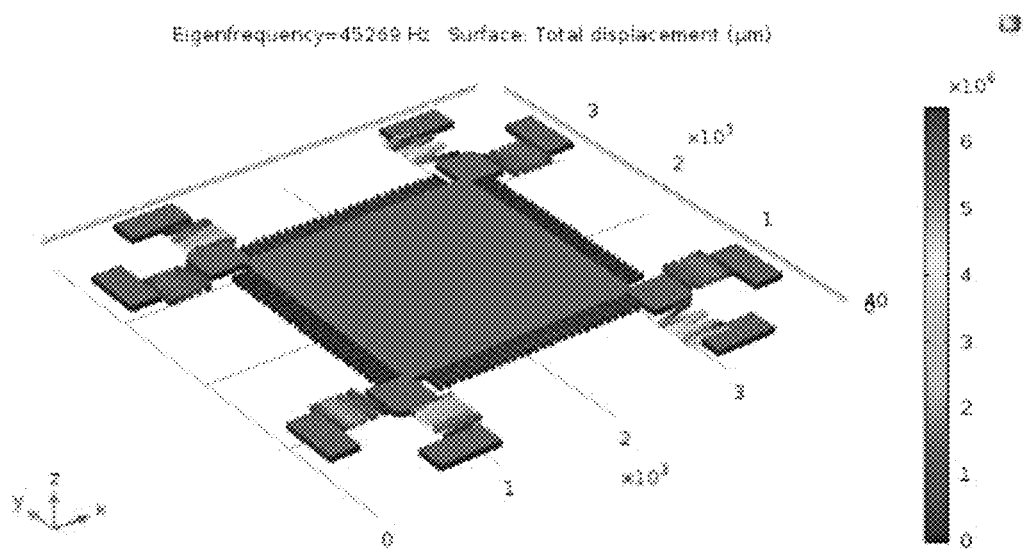
FIG. 13 demonstrates the result of a COMSOL analysis of an exemplary dual-axis design showing the structural resonant mode within tethers.

The first two resonant modes were of nearly identical frequency along the two diagonal in-plane lines, as seen in FIG. 7 and FIG. 8. The third mode, seen in FIG. 9, was in the out-of-plane direction, with a frequency only slightly above the first in-plane mode. This was expected, as the lumped mass would be nearly equivalent, and the 1:1 scaling limit placed during optimization led to similar compliances. A rotational mode was next, as seen in FIG. 10, followed by a pair of tiling modes about the diagonal axes in FIG. 11. The rotational and tilting modes were roughly twice as high in frequency, as compared to the fundamental. Much further along was the flexing mode of FIG. 12, followed by translational modes due to tether resonance that were nearly an order of magnitude higher in frequency, shown in FIG. 13.

Example 4—Characterization of the Dual Axis Function

The exemplary dual-axis wall stress sensor described herein comprises frontside wirebond electrical connections with a floating element having a size of 2 mm by 2 mm and a targeted design bandwidth of 5 kHz, subjected to a wall shear stress of approximately 10 Pa. Modulation for the X-axis was done with a 1.2 MHz carrier frequency, while modulation for the Y-axis was done with a 1 MHz carrier frequency.

Figure 14:
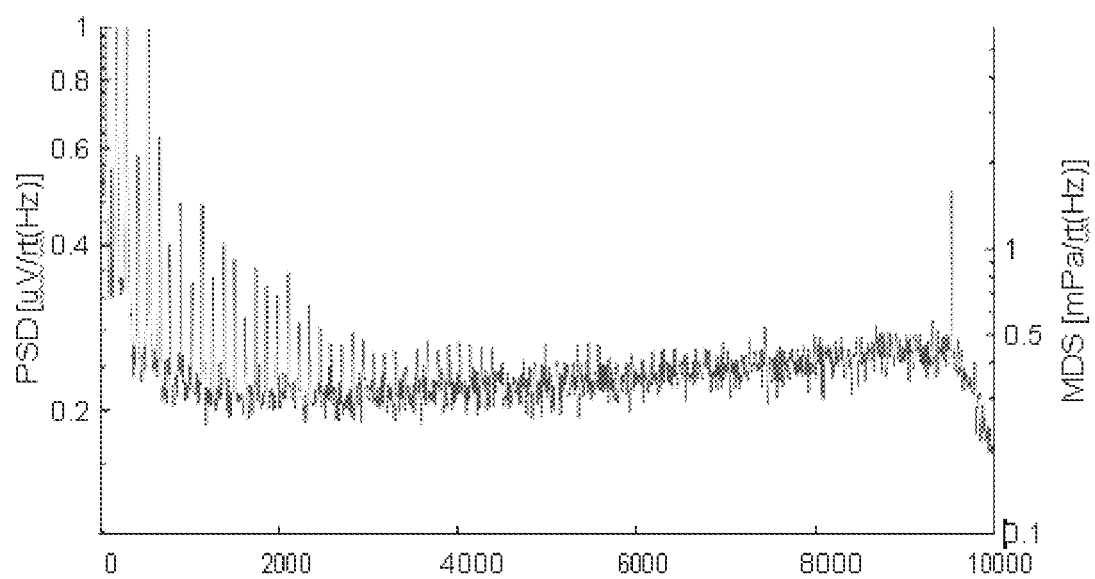
FIG. 14 is an x-axis power spectra noise floor of an exemplary dual-axis shear stress sensor in a plane wave tube utilizing a 1.2 MHz carrier frequency.
Figure 15:
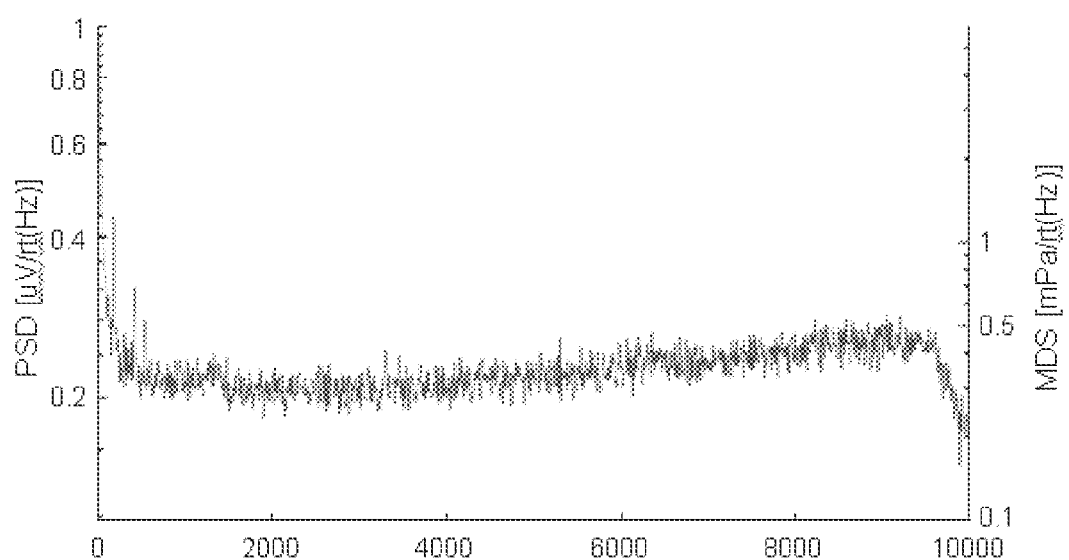
FIG. 15 is a y-axis power spectra noise floor of an exemplary dual-axis shear stress sensor in a plane wave tube utilizing a 1 MHz carrier frequency.

Electrical noise floor measurements, with the sensor installed into a plane wave tube testing rig, are seen in FIG. 14 for the X-axis and FIG. 15 for the Y-axis, biased at 1.2 MHz and 1 MHz respectively. The power line spikes seen in the X-axis, at 60 Hz and associated harmonics, were present independent of bias frequency selection. That is, they were consistent with the X-axis of the particular packaged device, not the modulation electronics itself.

Example 5—Characterization of the Mean Shear Stress

Figure 16:
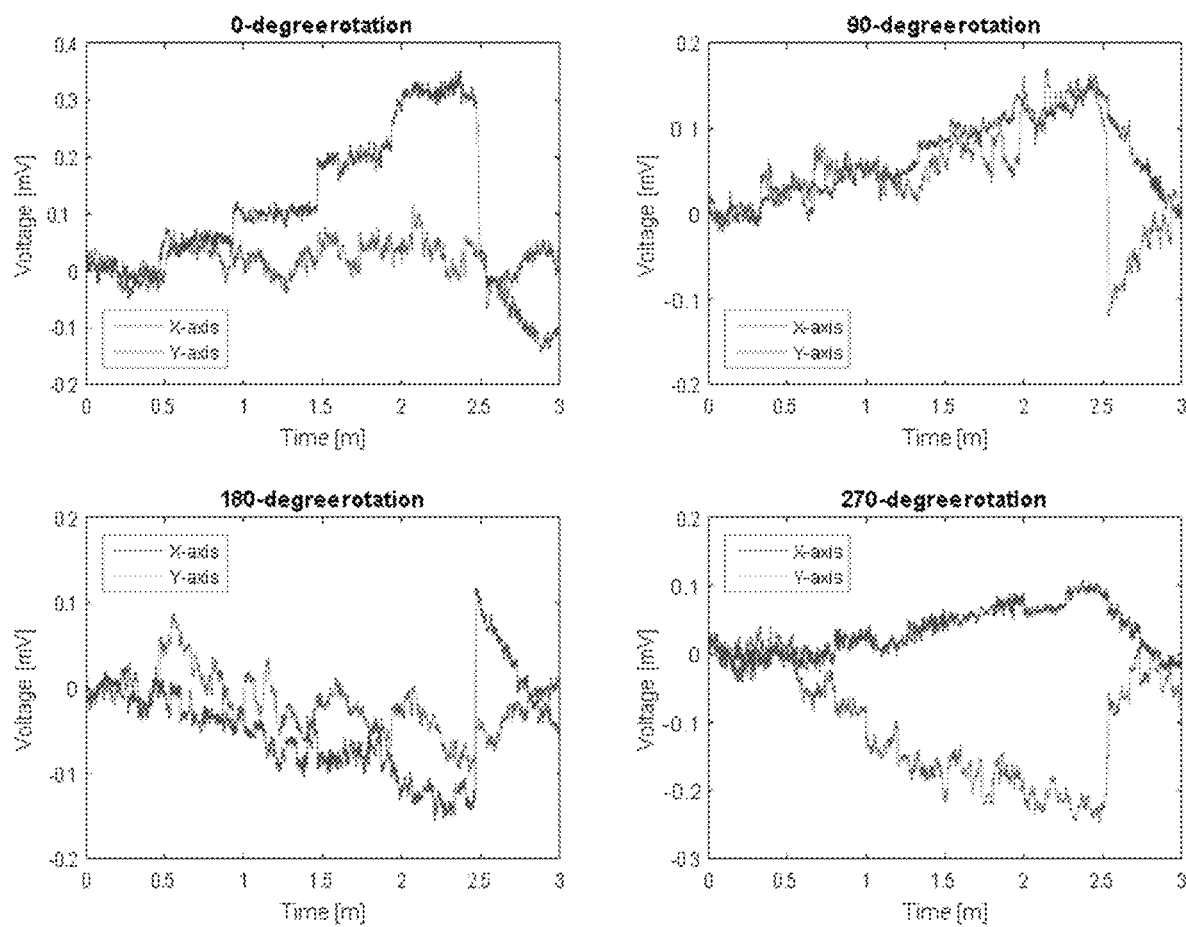
FIG. 16 shows the results of continuous measurements of mean output from an exemplary dual-axis shear stress sensor while sequentially increasing the flow rate in various rotational configurations.

The initial mean shear stress tests consisted of adjusting flow rate with a mass flow controller, allowing 5 minutes for full stabilization, followed by a 5 minute sampling of the sensor outputs. This process was then repeated for multiple flow rates, and the data was concatenated into a single data set for visualization. However, as seen in FIG. 16, these initial tests showed a constant trend in voltage output with respect to an increasing flow rate regardless of the rotational orientation.

To isolate the effect of non-shear response, which had a longer time scale, a series of quick ramp measurements were performed. First, sensor output was allowed 15 minutes to stabilize under low-flow conditions, as the dominant roll-up effect was seen during flow on or flow off transitions. Under continuous measurement, the flow rate was then increased to a total of 5 different levels (corresponding to MFC control voltages of 1 V-5V) for 30 seconds each, followed by turning the flow off. This resulted in less stable data, as there was not sufficient time for full settling or long time averages, but the differential between control points was driven primarily by flow forces. FIG. 16 shows the results for the four primary rotational configurations.

Figure 17:
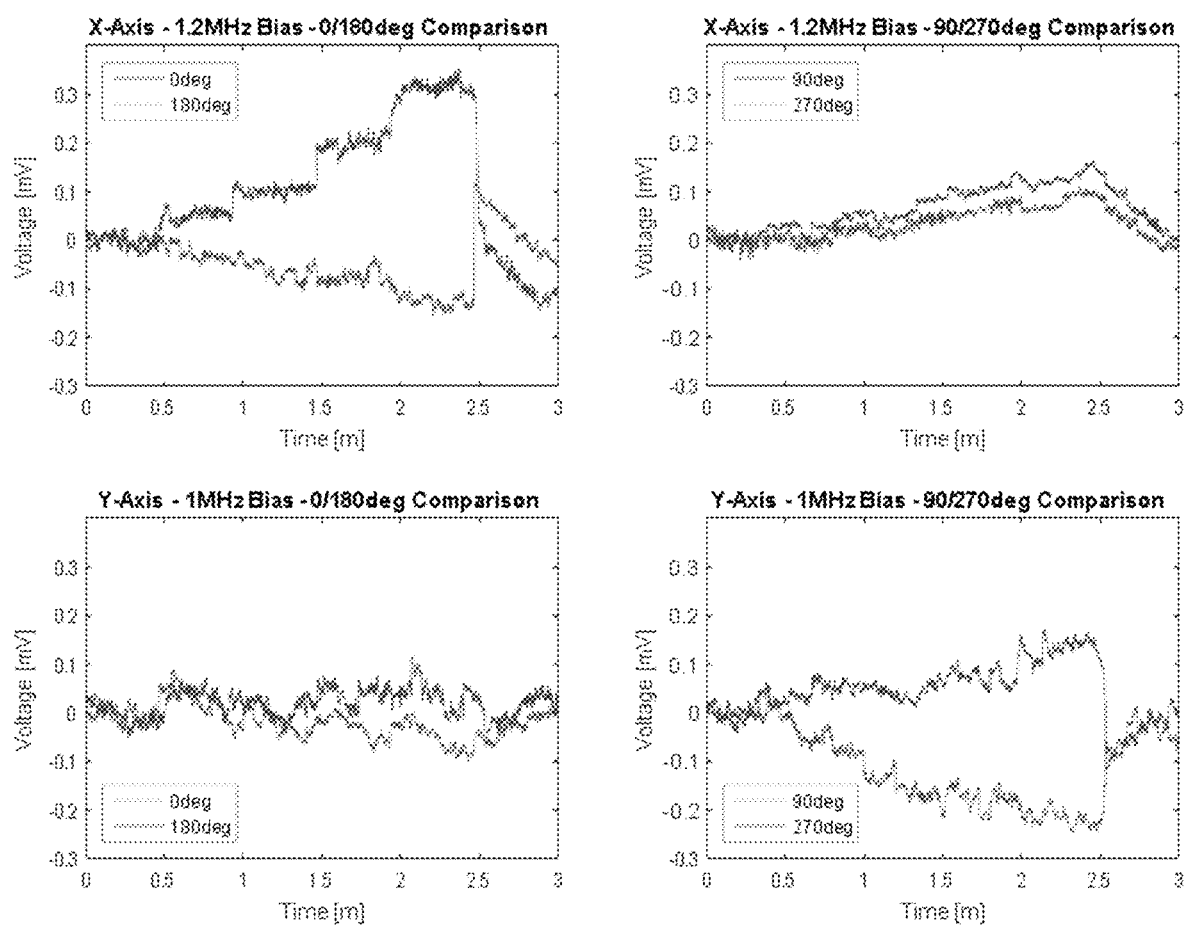
FIG. 17 shows the results of continuous measurements of mean output from an exemplary dual-axis shear stress sensor while sequentially increasing the flow rate with single-axis response isolated for rotational pairs.

A more instructive visualization is presented in FIG. 17, where responses from the X- and Y-axes have been separated. The data was then paired for the 0 and 180 degree tests, where the dominant shear direction was across the X-axis, as well as the 90 and 270 degree tests, where the dominant shear direction was across the Y-axis. For the 0 and 180 cases, there was a clear bifurcation in voltage changes for the X-axis, as would be expected for a shear stress response. The Y-axis response did not show a significant difference between the tests. Similarly, for the 90 and 270 cases, the Y-axis showed opposite voltage shifts, while the X-axis remained almost identical. Of note is the remaining presence of the rolling effect during all tests, most evident at flow-off, which remained in the same voltage direction regardless of flow orientation. This confirmed the ability of the sensor to detect directional mean shear, and also its present susceptibility to flow-force independent sources.

Figure 18:
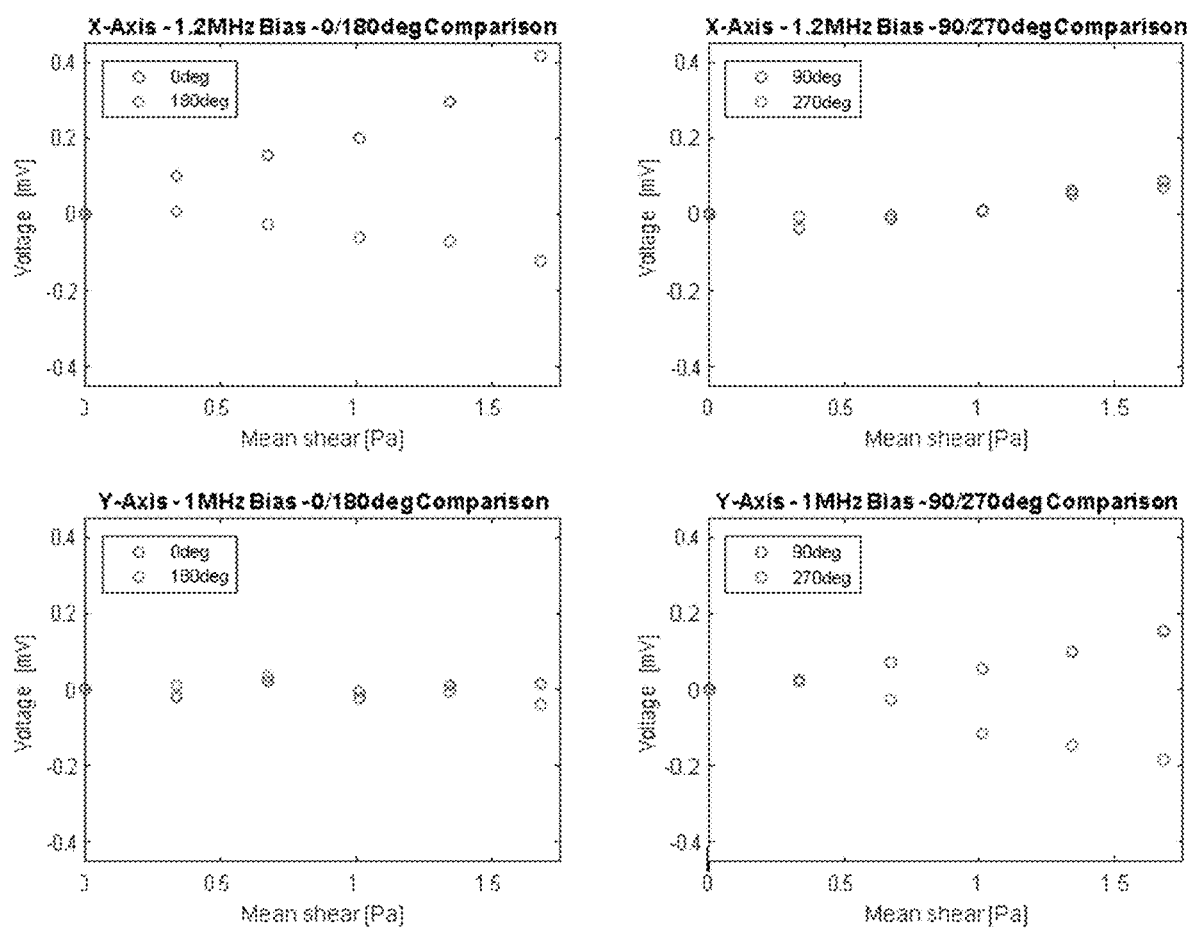
FIG. 18 shows the blocked and averaged values of mean output from an exemplary dual-axis shear stress sensor while sequentially increasing the flow rate with single-axis response isolated for rotational pairs.

An additional way of visualizing the data is to provide a mean average for each flow control interval. A 20 second block of data was extracted from each flow level, to mitigate averaging of intermittent flow data, and its mean computed. For clarity, the value computed for the flow-off data block, which was sampled last, was moved to the beginning of the vector. The result is seen in FIG. 18, which are approximations of sensitivity plots. Asymmetry between the curves is primarily attributed to the direction-independent sources.

Example 6—Measurement of the Means Shear Stress Using Secondary Methods

Figure 19:
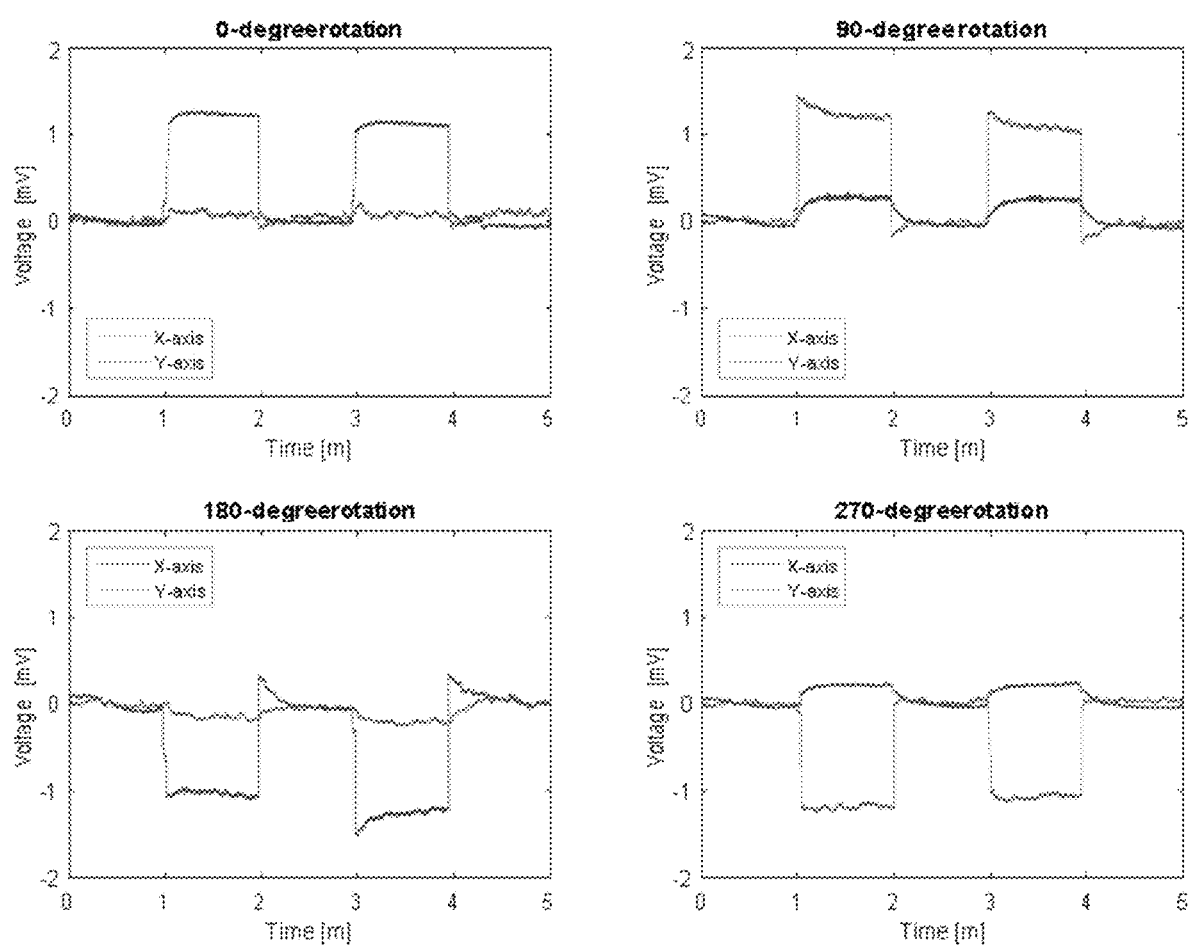
FIG. 19 shows the results of continuous measurements of mean output from an exemplary dual-axis shear stress sensor while alternating the flow rate from low to high, in different rotational configurations.

A secondary test was implemented that clearly displayed directionality of response. The sensor's response was again allowed to stabilize at a low-flow condition for approximately 15 minutes. The speed was then increased and decreased multiple times with 1-minute intervals in between, with a continuous measurement taken throughout. The result is seen in FIG. 19.

Figure 20:
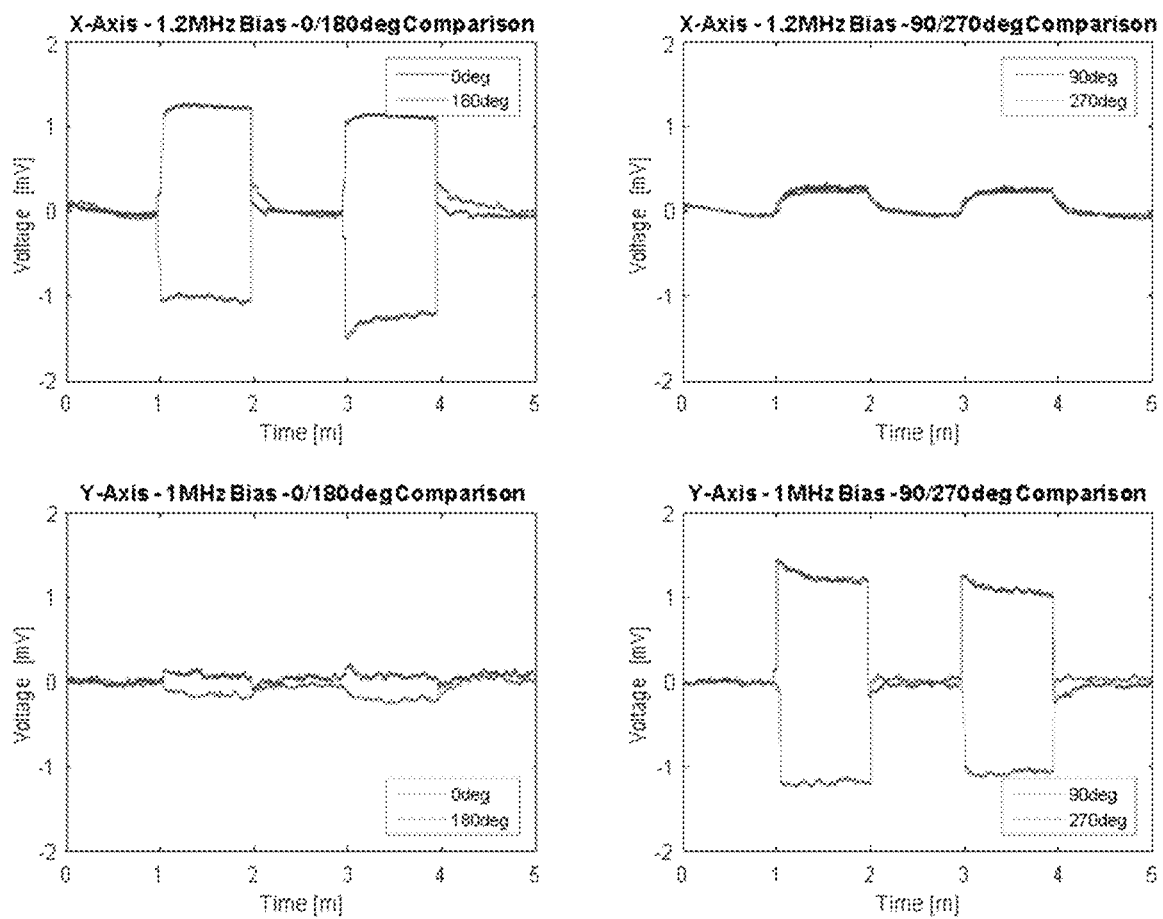
FIG. 20 shows the results of continuous measurements of mean output from an exemplary dual-axis shear stress sensor while alternating the flow rate from low to high, with single-axis response isolated for rotational pairs.

The same isolation by axis is shown in FIG. 20. For the 0 and 180 cases, there is a clearly defined step response at the minute mark intervals, where flow speed was changed, for the X-axis. This mirror pattern repeated in the Y-axis (e.g., the 90 and 270 cases), where the off-axis responses for both are minimal.

Figure 21:
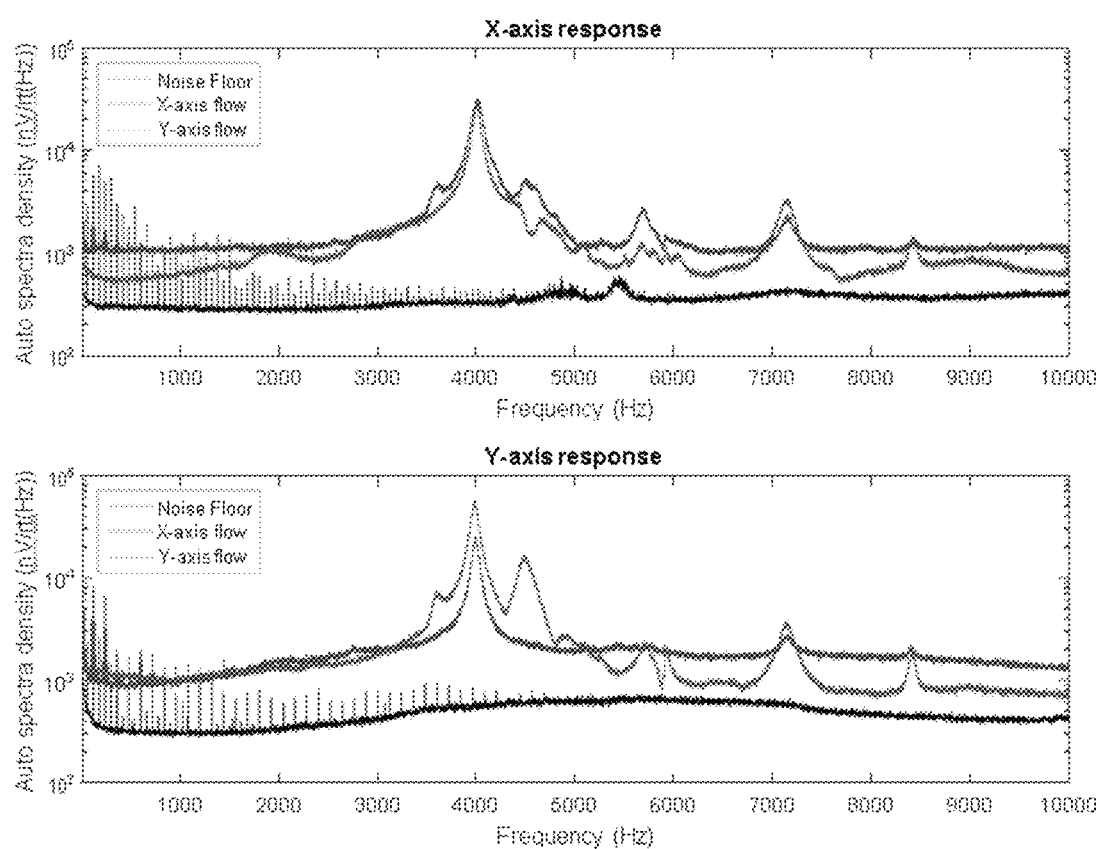
FIG. 21 shows the auto spectral density plots of an exemplary dual-axis shear stress sensor outputs in both x-axis and y-axis during flow cell testing.

An additional measurement was made of the sensor's output during high flow rate conditions utilizing a NI-4498 DAQ card. Sampled at 50 kHz for 100 seconds, FIG. 21 shows the autospectral density of each intendent axis under X-axis (0 degree) and Y-axis (90 degree) flows. The clearest resonant peak, shown for both axes in both test cases, is at 4 kHz. There are secondary peaks which border the main peak, presenting themselves in the on-axis alignment data at 3.5 kHz and 4.5 kHz. Further along the frequency spectrum more peaks are found at 5.7 kHz and 7.1 kHz as well.

Example 7—Determination of Sensitivity to Changes in Temperature

Figure 22:
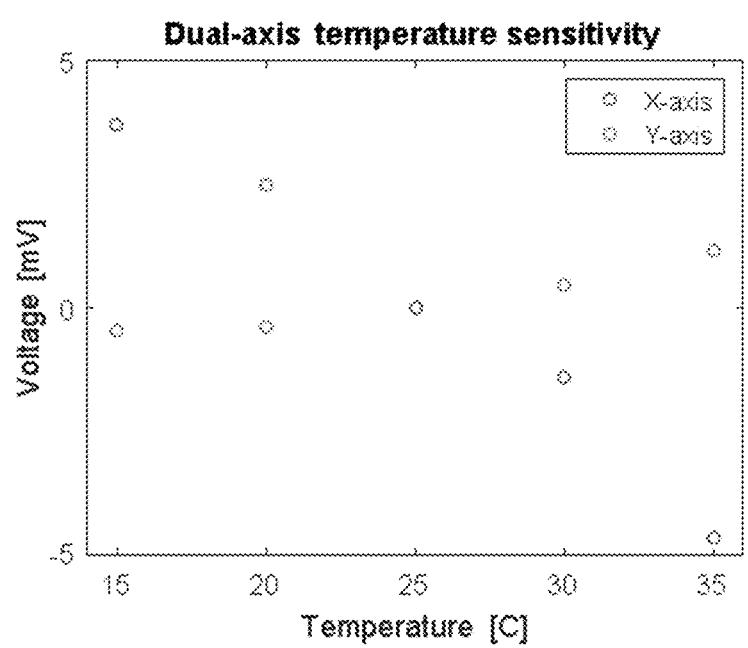
FIG. 22 shows a temperature sensitivity plot for an exemplary dual-axis shear stress sensor within an environmental chamber.

To determine its sensitivity to ambient temperature changes, the sensor was placed into the ESPEC environmental chamber. Keeping the relative humidity targeted at 80%, the temperature was increased from 15° C. to 35° C. in 5° C. increments. Data was sampled for 5 minutes at each step, averaged to a point value, and normalized about the output for 25° C., which was nearest to room temperature. The results are displayed in FIG. 22, where the sensitivity coefficients were −0.42 mV/° C. and 0.081 mV/° C. for the X and Y-axes respectively. These values, especially the X-axis sensitivity, gave evidence for temperature changes from fluid expansion in the flow cell affecting measurement output, especially as seen in FIG. 20.

Example 8—Characterization of the Dynamic Sensitivity

Figure 23:
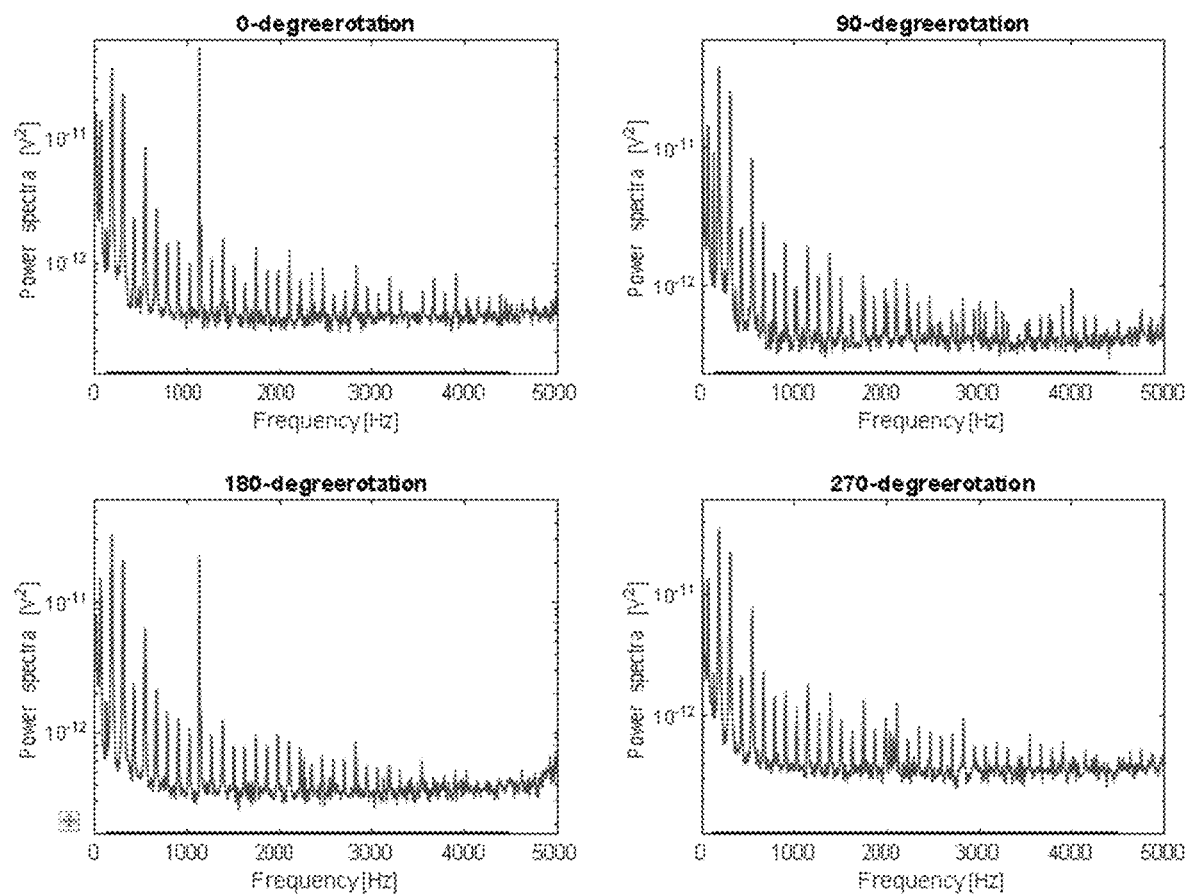
FIG. 23 shows x-axis power spectra response of an exemplary dual-axis shear stress sensor in a plane wave tube at 140 dB SPL for different rotational configurations.
Figure 24:
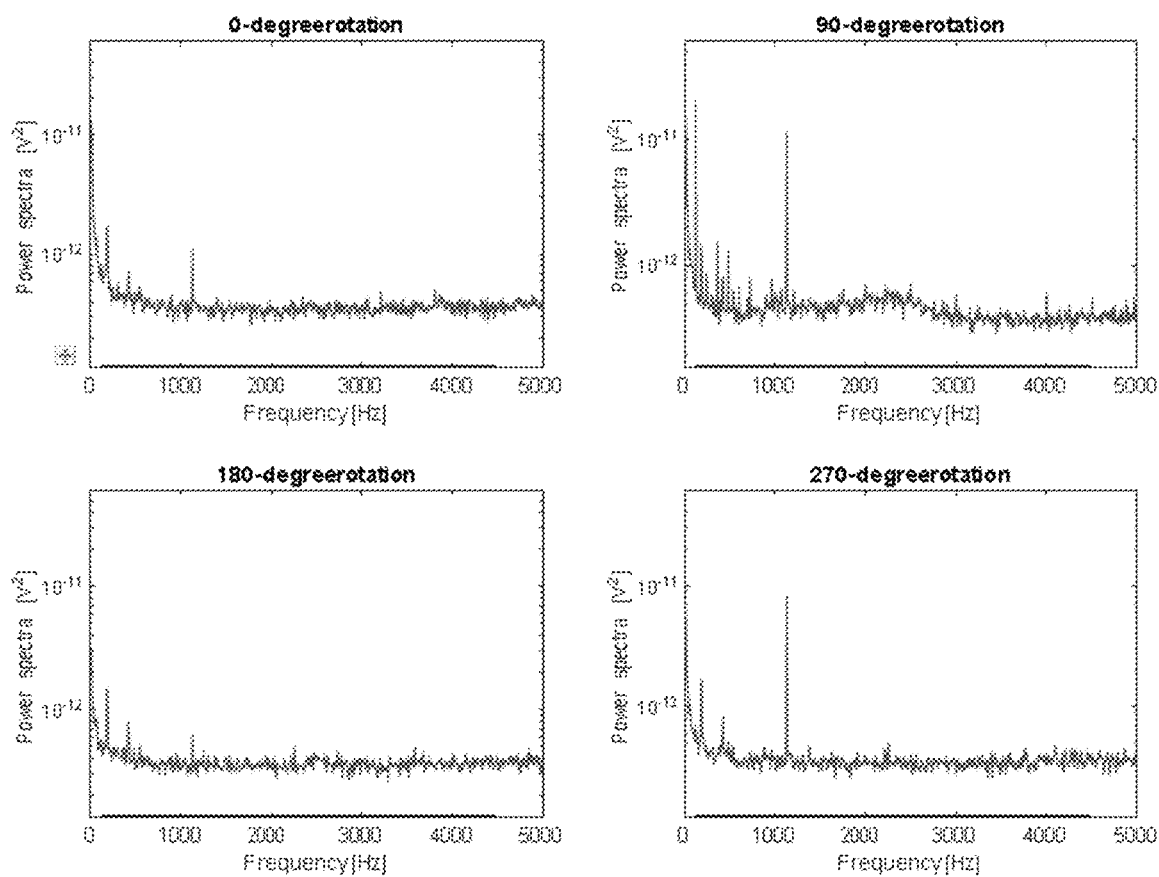
FIG. 24 shows y-axis power spectra response of an exemplary dual-axis shear stress sensor in a plane wave tube at 140 dB SPL for different rotational configurations.

Dynamic sensitivity testing was performed at a drive frequency of 1128 Hz, with pressure levels ranging from 90 dBSPLre20μPa to 155 dBSPLre20μPa, which corresponds to wall shear stress values of 0.6 mPa to 1.06 Pa. The test sweep is performed with the shear stress sensor in one position, and then repeated for other rotational configurations. FIGS. 23 and 24 show the measured PSD for the X and Y axis respectively when driven with 140 dBSPLre20μPa, or 0.2 Pa.

In the X-axis response, there is a significant spectral peak at 1128 Hz for the 0 and 180 degree positions as the oscillating shear gradient was moving across the X-axis of the device. When the sensor was orthogonally rotated, i.e., in the 90 and 270 degree positions, the peaks are no longer present. The opposite is true for the Y-axis, which shows a large response when the acoustic waves were propagating across the Y-axis of the device.

Due to the smoother noise floor of the Y-axis, the residual peak at 1128 Hz is still easily observable in the 'off-axis' configurations of 0 and 180 degrees. This was caused by a combination of mechanical cross-axis coupling and capacitive overlap changes, from both shear- and pressure-driven deflections. Although the sensor was positioned at a pressure node, the finite size of the device negates the pure cusp assumption of zero pressure, and Z-axis deflections were resulted. When the acoustic SPL was further increased, as is the case in FIGS. 25 and 26 with 155 dBSPLre20μPa, the non-linear harmonic acoustic effects are readily seen. Because the cross-axis stiffness ratio was relatively small for these pilot devices, the first acoustic harmonic at 2256 Hz, a pressure maximum over the device, is particularly strong.

Figure 25:
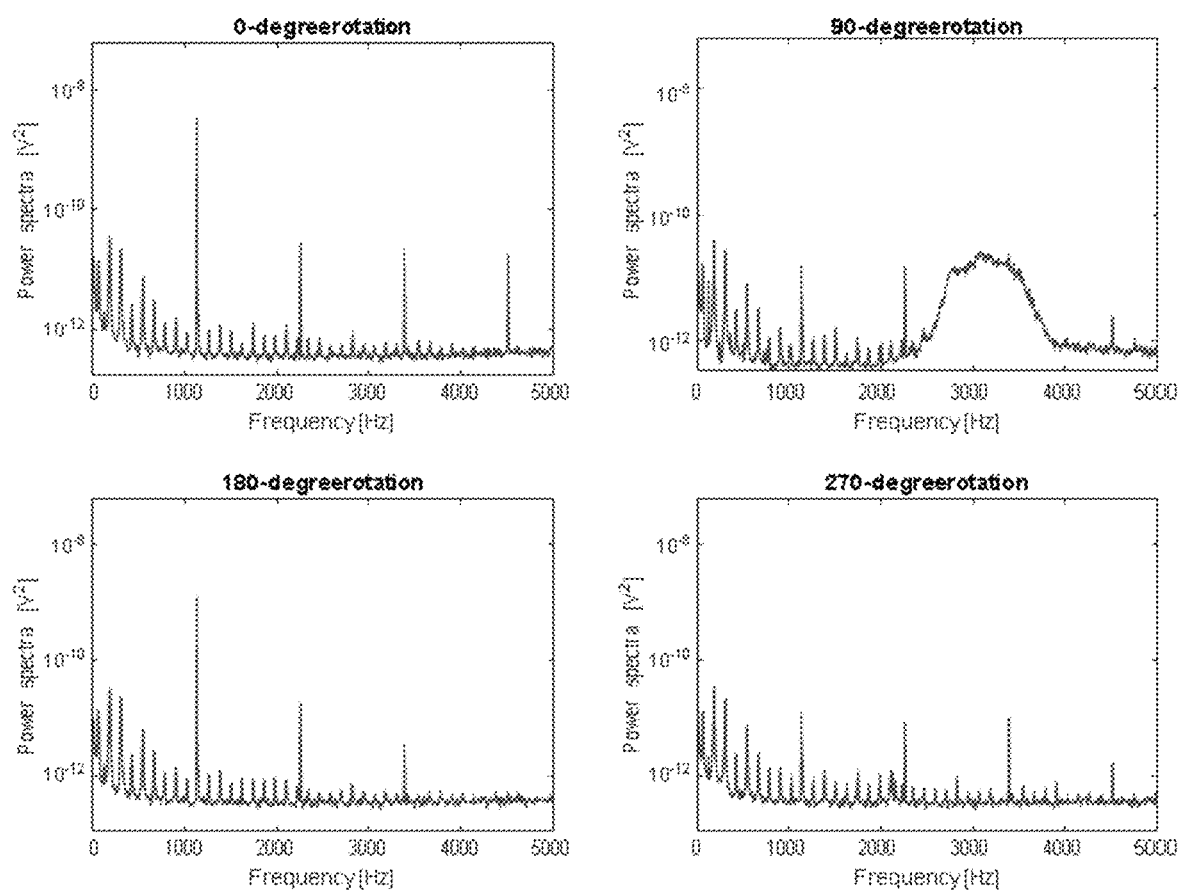
FIG. 25 shows x-axis power spectra response of an exemplary dual-axis shear stress sensor in a plane wave tube at 155 dB SPL for different rotational configurations.
Figure 26:
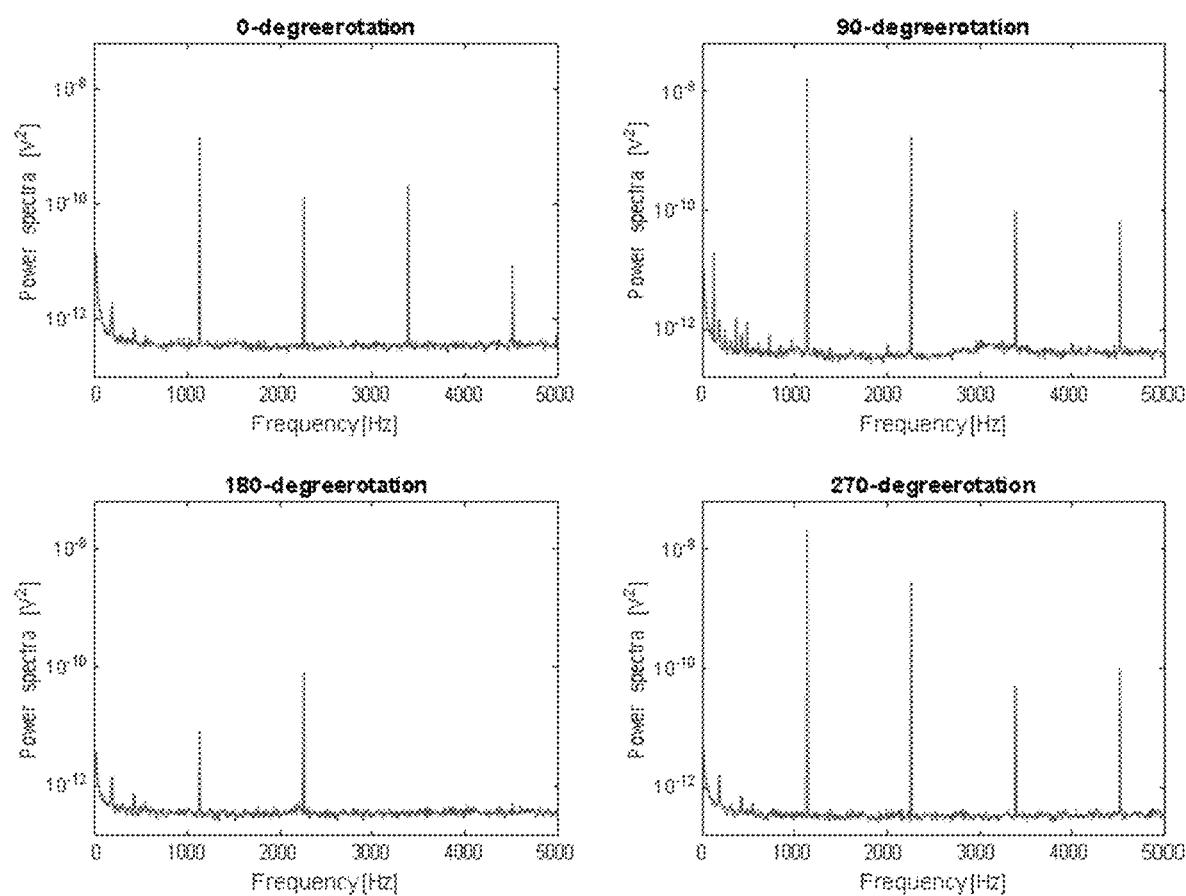
FIG. 26 shows y-axis power spectra response of an exemplary dual-axis shear stress sensor in a plane wave tube at 155 dB SPL for different rotational configurations.

The large rounded 'hump' centered around 3 kHz in the 90 degree rotation shown in FIG. 25 is indicative of transient noise problems encountered with the sensor. Backside contacts of the sensor were not enclosed, and multiple ground loop paths existed between the various bias connectors and modulation boxes. While this afforded maximum flexibility for bias attachment during debugging, it also resulted in the sensor's susceptibility to electrical interference and noise coupling. With operational viability of the sensor platform confirmed, future packaging iterations can address these issues.

Figure 27:
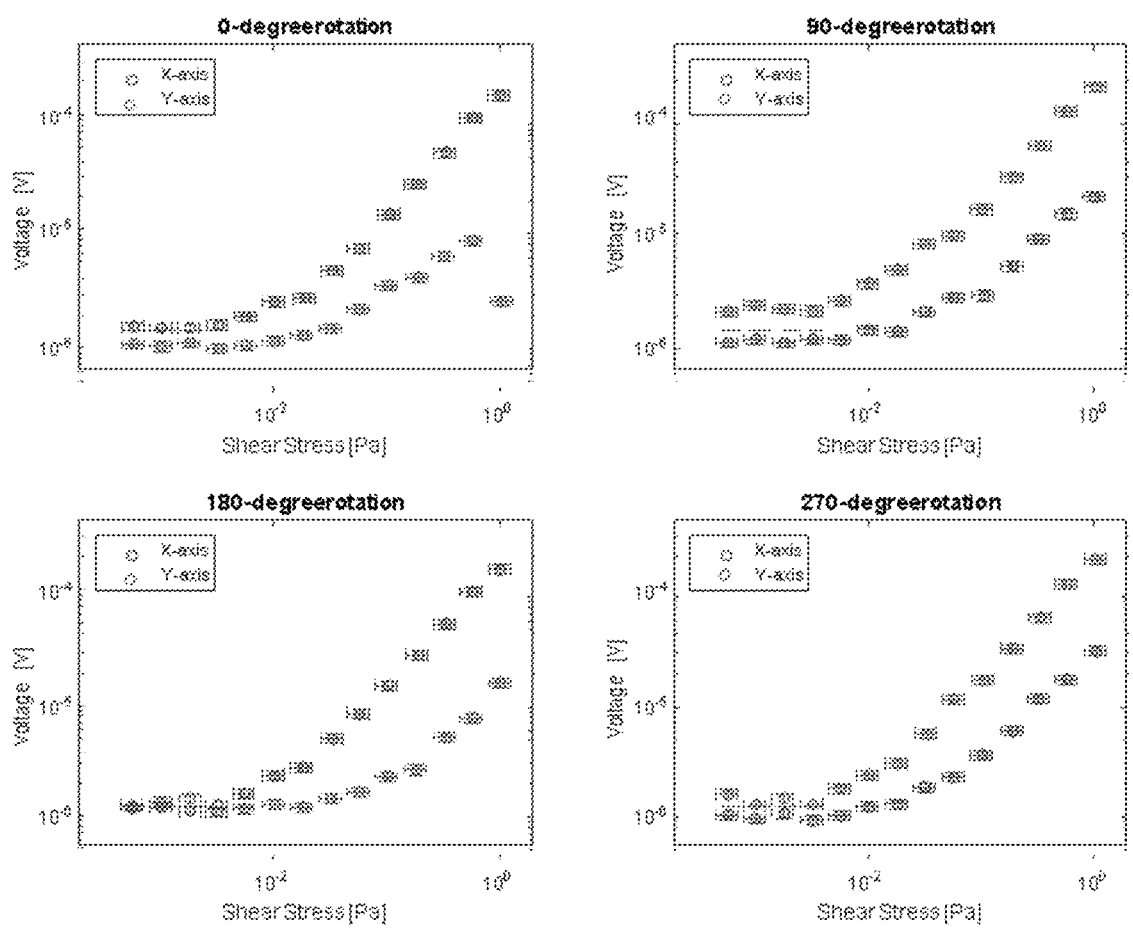
FIG. 27 shows sensitivity curves of an exemplary dual-axis shear stress sensor in different rotational configurations.

Results from the calibration sweeps from the four orthogonal positions are seen in FIG. 27. As indicated in the individual spectra, there is a clear bifurcation between response for 'on-axis' and 'off-axis' shear stress inputs for each sensing direction. The onset of 'off-axis' response was generally uniform, around 140 dBSPLre20µPa in all cases. The Y-axis exhibited a slightly lower response than the X-axis in "on-axis' cases. Non-linear effects became significant at 155 dBSPLre20µPa.

Figure 28:
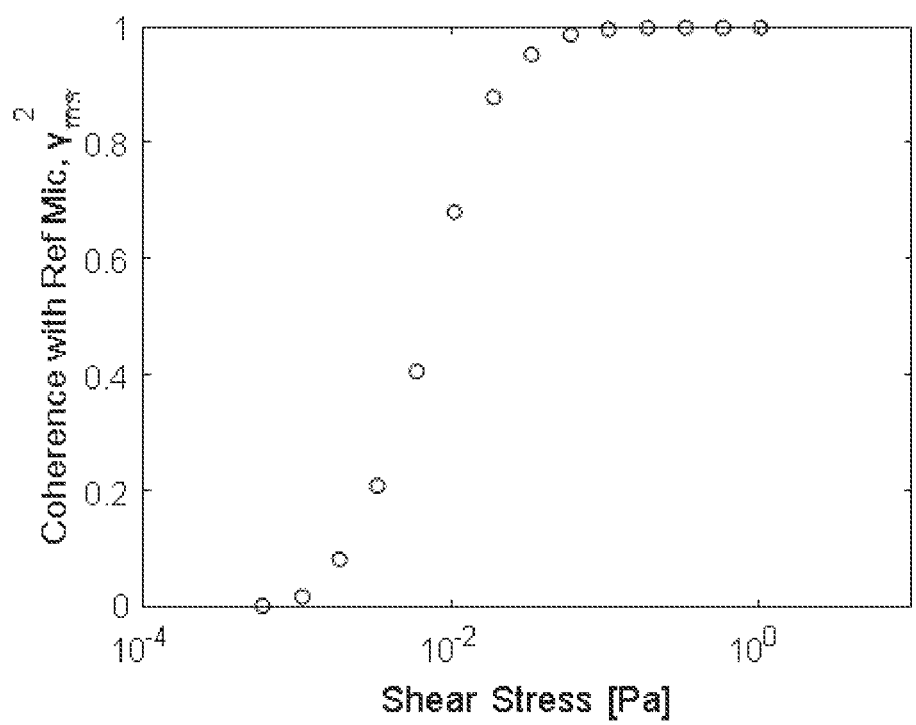
FIG. 28 demonstrates the coherence between the x-axis of an exemplary dual-axis shear stress sensor in 0 degree rotational configuration and an end-mounted reference microphone.

To establish the viable data points for calculating dynamic sensitivity a metric of coherence was used. FIG. 28 displays the coherence between the X-axis output and the end-mounted reference microphone for the 0 degree rotation configuration. For a given data point, if the measured coherence between respective axis and reference microphone was greater than 0.9, the data point was included during linear fit sensitivity estimates.

Utilizing the coherence metric, sensitivity estimates were generated and displayed in Table 3 below. There is approximately an order of magnitude difference between on- and off-axis responses. Off-axis responses, driven mostly by pressure, are comparable between all four cases. The direct Y-axis shear sensitivity is significantly lower than the X-axis. The lack of true symmetry in response could derive from a number of sources, including skewed fabrication tolerances, preferential capacitive coupling, and fluid field disturbance as a result of wirebonds and a non-hydraulically smooth surface.

TABLE 3

Sensitivity calculations for dynamic response of vector shear stress measurement system in different rotational configurations within the acoustic plane wave tube.

| Rotation (degrees) | X-axis (mV/Pa) | Y-axis (mV/Pa) |
|---|---|---|
| 0 | 0.139 | 0.0149 |
| 90 | 0.0249 | 0.161 |
| 180 | 0.145 | 0.0282 |
| 270 | 0.0282 | 0.169 |
| Pressure | 4.91e−5 | 1.03e−5 |

Figure 29:
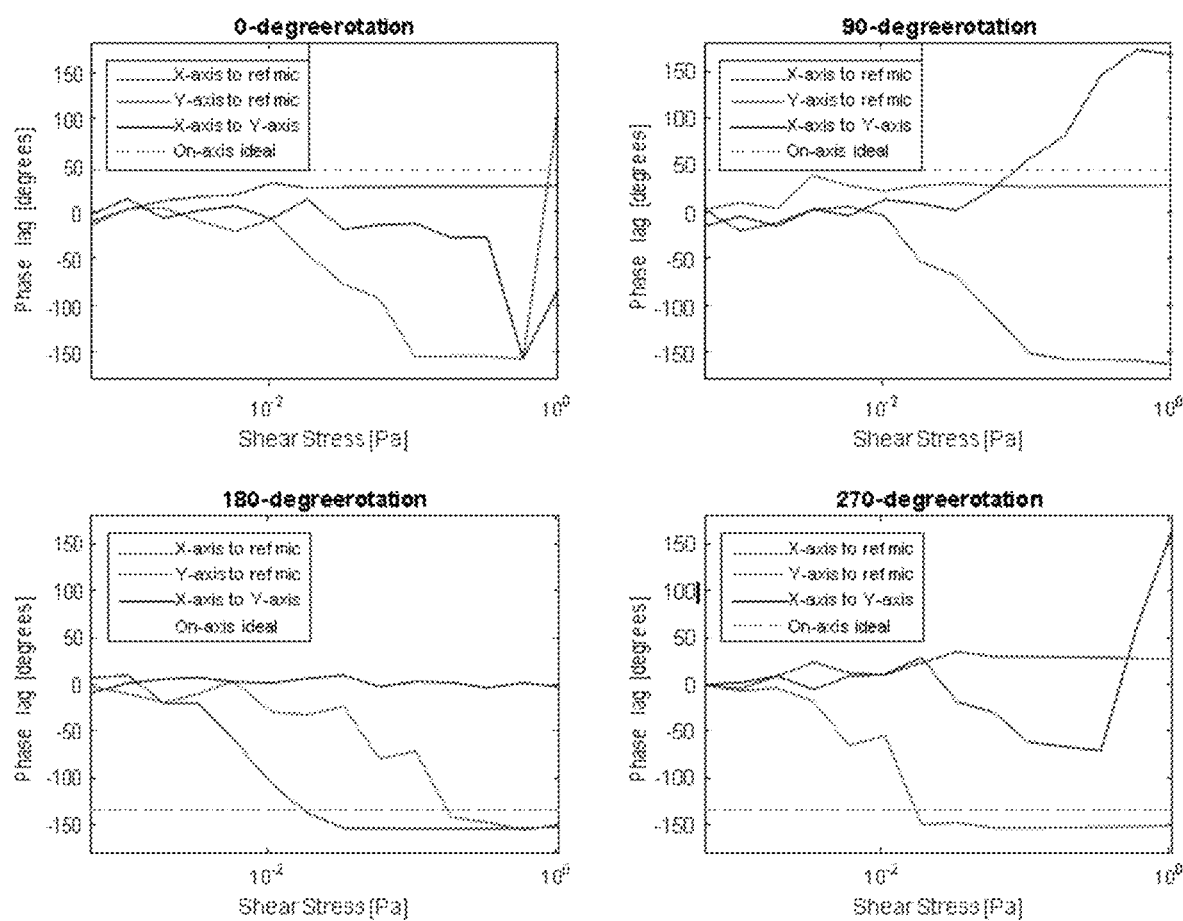
FIG. 29 demonstrates relative phase lag curves for an exemplary dual-axis shear stress sensor in different rotational configurations, referenced to end-wall pressure sensor.

Relative phase lag between shear sensor output and the reference microphone can be thought of as a directional indicator for the dynamic flow field. Thus, if the shear sensor is rotated 180 degrees, the relative phase lag will also shift by 180 degrees, as the shear forces are impinging in the opposite direction for the same triggered time stamp. Phase lag plots, utilizing the same data sensitivity data set, are seen in FIG. 29. For the X-axis, at 0.2 Pa, the measured shift between the 0 and 180 rotations was 176 degrees. Similarly, for the Y-axis at 0.2 Pa, the measured shift between the 90 and 270 degree rotations was 184 degrees. Also of note is the sharp movement of the off-axis phase lag when non-linear effects begin to set in.

Figure 30:
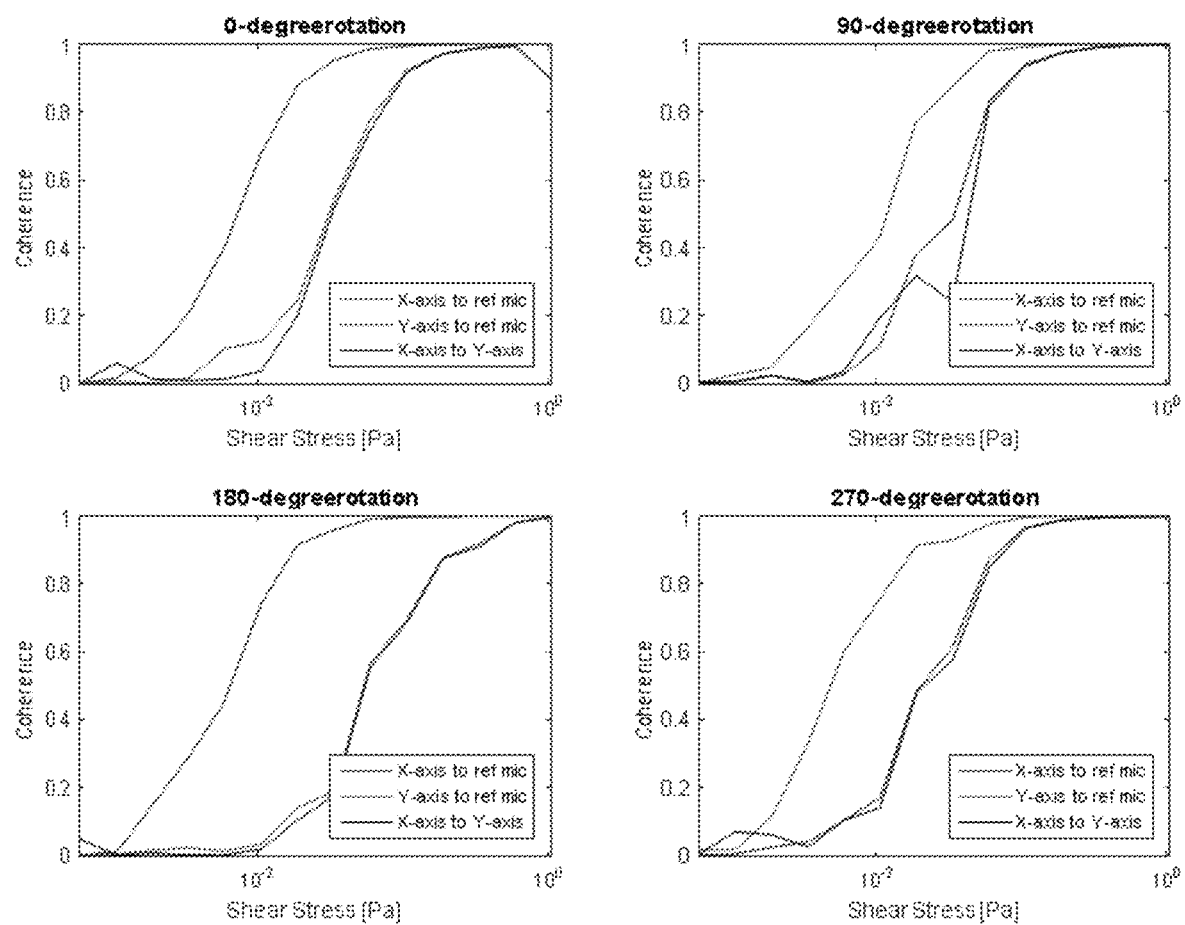
FIG. 30 shows the coherence between different values for an exemplary dual-axis shear stress sensor in different rotational configurations.

Similar plots of the coherence between each axis and the reference microphone, as well as between the axes themselves, are seen in FIG. 30. Most significantly is the close agreement between off-axis to microphone and cross-axis coherence. This is indicative of negligible cross-axis coupling for shear stress inputs, where values are lower than pressure response modes for both axes combined. Further validation of this effect can include a dynamic shear stress input which does not subject the sensor to strong pressures, or a re-design with lower pressure sensitivity overall.

Figure 31:
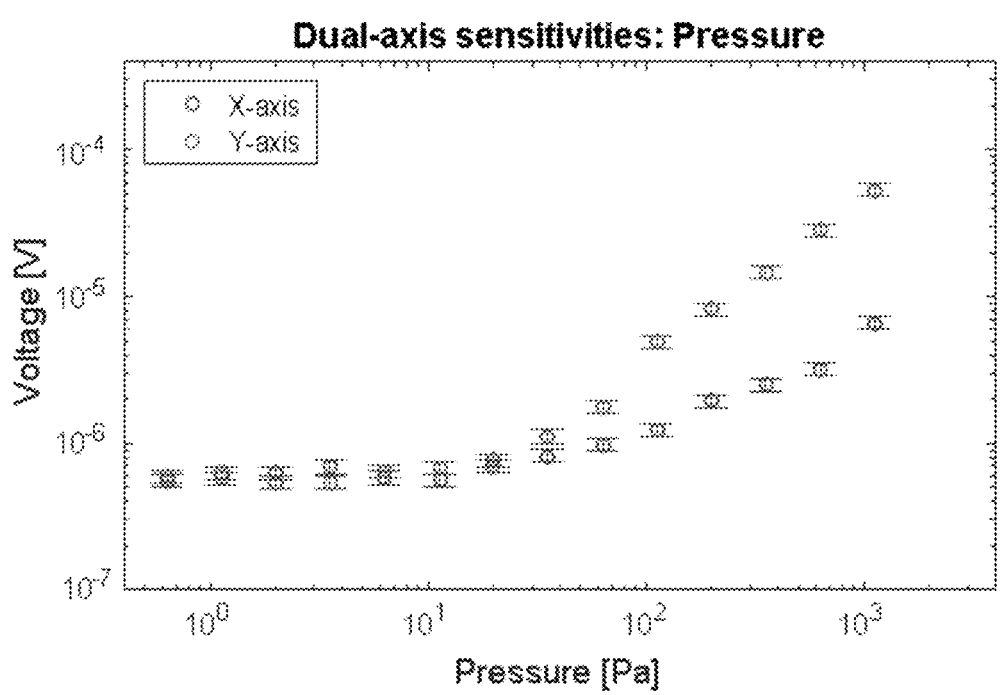
FIG. 31 shows pressure sensitivity curves for an exemplary dual-axis shear stress sensor.

Direct sensitivity to pressure was measured by increasing the drive frequency, such that a pressure maximum was established within the standing wave pattern at the same sensor location. 2256 Hz was used in this case, and the same SPL sweep produced the results shown in FIG. 31, where sensitivity for the X and Y-axes was 49.1 nV/Pa and 10.3 nV/Pa, respectively.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] Naughton, J. W., and Sheplak, M. "Modern Developments in Shear Stress Measurement," *Progress in Aerospace Sciences*, Vol. 38, pp. 515-570, 2002.

[2] Schmidt, M. A., Howe, R. T., Senturia, S. D., and Haritonidis, J. H., "Design and Calibration of a Microfabricated Floating Element Shear-Stress Sensor," *Transactions of Electron Devices*, Vol. ED-35, 1988, pp. 750-757.

[3] Winter, K. G., "An Outline of the Techniques Available for the Measurement of Skin Friction in Turbulent Boundary Layers," *Progress in the Aeronautical Sciences*, Vol. 18, 1977, pp. 1-57.

[4] N. Hutchins, T. B. Nickels, I. Marusic, and M. S. Chong, "Hot-wire spatial resolution issues in wall-bounded turbulence,"
*Journal of Fluid Mechanics*, vol. 635, p. 103, September 2009.

[5] V. Chandrasekharan, J. Sells, J. Meloy, D. P. Arnold, and M. Sheplak, "A Microscale Differential Capacitive Direct Wall-Shear-Stress Sensor," *Journal Of Microelectromechanical Systems*, vol. 20, no. 3, 2011.

[6] P. Bruschi, P., Nannini, A., Pacia, D., and Pieri, F., "A method for cross-sensitivity and pull-in voltage measurement of
MEMS two-axis accelerometers," *Sensors and Actuators A*, 123-124, 2005.

[7] Barillarol, G., Molfese, A., Nannini, A., and Pieri, F., "Analysis, simulation and relative performance of two kinds of
serpentine springs," *Journal of Micromechanics and Microengineering*, Vol. 15, 2005, pp. 736-746.

[8] Beresh, S. J., Henfling, J. F., Spillers, R. W., and Pruett, B. O. M., "Fluctuating wall pressures measured beneath a supersonic turbulent boundary layer," *Physics of Fluids*, Vol. 23, 075110, 2011.

[9] U.S. Pat. No. 8,833,175.

What is claimed is:

1. A device for measuring wall shear stress, the device comprising:
   a sensor, wherein the sensor senses wall shear stress vectors in two in-plane axes at a surface of an object in a fluid field and generates an output signal; and
   an interface circuit comprising a modulation section and a demodulation section configured to perform simultaneous modulation/demodulation at multiple frequencies, wherein the sensor comprises a floating element located in the center of the sensor,
wherein the floating element comprises a set of differential capacitive comb fingers extending respectively from each side of the floating element, and
wherein at least one two-dimensional tether extends from each set of differential capacitive comb fingers.

2. The device according to claim 1, wherein the sensor is bulk-micromachined.

3. The device according to claim 1, wherein each set of the differential capacitive comb fingers provides a capacitive half-bridge for each in-plane axis of measurement.

4. The device according to claim 1, wherein the at least one two-dimensional tether has a configuration selected from serpentine, folded-beam, multi-level, and crab-leg.

5. The device according to claim 1, wherein the at least one two-dimensional tether has a serpentine configuration.

6. The device according to claim 5, wherein the serpentine configuration comprises an odd-number of meanders that yields equal stiffness coefficients along both in-plane axes.

7. The device according to claim 6, wherein the device is configured to measure both mean and fluctuating components of the wall shear stress vectors.

8. The device according to claim 7, wherein the device is configured to measure wall shear stress vectors directly, absent any need for validation using secondary measurements or models.

9. A device for measuring wall shear stress, the device comprising:
a floating element including a plurality of peripheral sides;
a plurality of sets of capacitive comb fingers, wherein at least one set of capacitive comb fingers (a) is positioned on each of the plurality of peripheral sides of the floating element, and (b) extends from each of the plurality of peripheral sides of the floating element; and
a plurality of tethers, wherein at least one of the plurality of tethers is connected to each of the plurality of sets of capacitive comb fingers,
wherein the floating element includes a flat surface, and
wherein the plurality of sets of capacitive comb fingers surround the floating element.

10. The device according to claim 9, wherein the floating element has a shape to define a plurality of axes.

11. The device according to claim 10, wherein the floating element is quadrangular.

12. The device according to claim 11, wherein each of the plurality of sets of capacitive comb fingers provides a capacitive half-bridge for each of the plurality of axes.

13. The device according to claim 12, wherein the plurality of tethers are arranged symmetrically.

* * * * *